US012710488B2

(12) United States Patent
Endres et al.

(10) Patent No.: US 12,710,488 B2
(45) Date of Patent: Aug. 18, 2026

(54) MAGNETORESISTIVE SENSOR HAVING A SHIELDING ELEMENT WITH VORTEX MAGNETIZATION

(71) Applicant: Infineon Technologies AG, Neubiberg (DE)

(72) Inventors: Bernhard Endres, Nabburg (DE); Andreas STRAßER, Regensburg (DE); Juergen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 237 days.

(21) Appl. No.: 18/591,878

(22) Filed: Feb. 29, 2024

(65) Prior Publication Data

US 2024/0310461 A1 Sep. 19, 2024

(30) Foreign Application Priority Data

Mar. 13, 2023 (DE) ........................ 102023202258.3

(51) Int. Cl.
*G01R 33/09* (2006.01)
*H10N 50/10* (2023.01)

(52) U.S. Cl.
CPC ......... *G01R 33/093* (2013.01); *G01R 33/098* (2013.01); *H10N 50/10* (2023.02)

(58) Field of Classification Search
CPC ........................... G01R 33/093; G01R 33/098
See application file for complete search history.

(56) References Cited

U.S. PATENT DOCUMENTS

2003/0133234 A1 7/2003 Furukawa et al.
2005/0174701 A1* 8/2005 Kasiraj ................ G11B 5/1278
2008/0180865 A1 7/2008 Min et al.
2018/0144766 A1* 5/2018 Quan .................. G11B 5/3932
2020/0011943 A1* 1/2020 Zimmer .............. H01F 10/3268

FOREIGN PATENT DOCUMENTS

DE 102016102214 A1 8/2017
JP 2011145273 A 7/2011

* cited by examiner

*Primary Examiner* — Alesa Allgood
(74) *Attorney, Agent, or Firm* — Harrity & Harrity, LLP

(57) ABSTRACT

A magnetoresistive sensor includes at least one magnetoresistive element having a layer stack. The layer stack has at least one free layer that has a magnetization that is changeable in the layer plane and that varies depending on the field strength of an external magnetic field acting parallel to the layer plane. The magnetoresistive sensor furthermore has a shielding element that has a vortex magnetization with a closed flux in the layer plane, wherein the shielding element is configured, in the presence of the external magnetic field, to generate a linear magnetic stray field that is directed counter to the external magnetic field.

20 Claims, 16 Drawing Sheets

MAGNETORESISTIVE SENSOR HAVING A SHIELDING ELEMENT WITH VORTEX MAGNETIZATION

CROSS-REFERENCE TO RELATED APPLICATION

This application claims priority to German Patent Application No. 102023202258.3 filed on Mar. 13, 2023, the content of which is incorporated by reference herein in its entirety.

TECHNICAL FIELD

The innovative concept described herein relates to a magnetoresistive sensor having a linear working range, wherein the magnetoresistive sensor has a shielding element that is configured to shield or attenuate external magnetic fields.

BACKGROUND

Magnetoresistive sensors are also referred to as xMR sensors for short. These include for example TMR sensors (tunnel magnetoresistance), AMR sensors (anisotropic magnetoresistance), GMR sensors (giant magnetoresistance), CMR sensors (colossal magnetoresistance) and the like.

In principle, in magnetoresistive sensors, the electrical resistance or conductance thereof changes when the sensor is exposed to a magnetic field. Basically, xMR sensors in this case detect the field strength parallel to a reference direction. This is achieved through a resistance-based measurement using various magnetoresistive sensor elements.

One example of an xMR sensor is a TMR sensor that uses the principle of a magnetic tunnel resistance. A magnetic tunnel resistance is based on a magnetoresistive effect that occurs in magnetic tunnel contacts, what are known as MTJs (magnetic tunnel junctions). In the simplest case, an MTJ has two ferromagnetic layers, for example made of CoFe. Between the two ferromagnetic layers, there is a tunnel barrier (TB) layer, for example made of $Al_2O_3$ or MgO. If the tunnel barrier is thin enough, typically a few nanometers or thinner, then electrons are able to “tunnel” from one ferromagnetic layer into the other ferromagnetic layer through the tunnel barrier. This state is forbidden in classical physics, which is why the principle of magnetic tunnel resistance is a purely quantum-mechanical phenomenon.

A layer consisting of an antiferromagnet is arranged adjacent to one of the two ferromagnetic layers, in a manner similar to the GMR effect. The antiferromagnetic layer is used to fix the magnetization direction of the directly adjacent ferromagnetic layer in one direction, such that its fixed magnetization direction is not able to be changed by external fields. This ferromagnetic layer directly adjacent to the antiferromagnetic layer is therefore also referred to as a fixed or pinned layer—PL. However, the upper ferromagnetic layer, which is not directly adjacent to the antiferromagnetic layer, is not fixed, meaning that its magnetization direction is able to follow an external magnetic field. The magnetization direction of this non-fixed ferromagnetic layer is thus freely rotatable, which is why this ferromagnetic layer is also referred to as a free layer—FL.

The magnetization direction of the free layer may be varied for example by way of an external magnetic field. The orientation or magnetization direction of the free layer relative to the pinned layer in this case determines the conductance or resistance of the tunnel contact. If the magnetization direction of the free layer runs parallel to and in the same direction with respect to the magnetization direction of the pinned layer, then electrons are able to tunnel through the tunnel barrier more easily, whereby the tunnel contact (MTJ) has a high conductance or a low resistance. If, on the other hand, the magnetization direction of the free layer is directed counter, that is to say anti-parallel, to the magnetization direction of the pinned layer, then the electrons are no longer able to tunnel through the tunnel barrier as easily, as a result of which the resistance of the tunnel contact (MTJ) is increased or its conductance is reduced.

For the reasons mentioned above, xMR sensors may be used for example as linear distance-measuring sensors or else as angle sensors (360°), wherein the orientation of the external magnetic field may be determined based on the conductance of the MTJ. The acquired raw signals may in this case be made available as differential output signals for processing by a microcontroller.

If the free layer of the MTJ has an intrinsic restoring force for its magnetization, for example due to an impressed magnetic anisotropy, then the sensor may be used to detect a field strength of an externally applied magnetic field. Such a magnetic anisotropy may be impressed for example by a bias field or else via what is known as a shape anisotropy initiated by the structural shape. This anisotropy then causes the magnetization of the free layer to change as the strength of the external magnetic field increases and to adopt its defined starting state after the external magnetic field is switched off. As a result, this achieves a linear change in conductance with the external magnetic field, which may be used to measure the external magnetic field strength.

Another possibility for providing a defined basic state is that of using a free layer geometry, which, due to its inherent shape anisotropy, forces the formation of vortex magnetization of the free layer. Vortex magnetization is in-plane magnetization with a self-contained (for example circular) magnetic flux. One advantage of vortex magnetization is, inter alia, that remagnetization by external magnetic fields is largely hysteresis-free. Vortex magnetization forms in particular in structures with non-elongate geometry, such as for example in circular disks or cylinders.

Regardless of the origin of the anisotropy (impressed anisotropy vs. shape anisotropy) of the free layer, it is desirable for the magnetoresistive sensor able to be produced thereby to exhibit linear behavior over a widest possible range. This may be achieved for example by varying the dimensions of the free layer. In particular, a reduction in the diameter and an increase in the layer thickness of the free layer lead to a considerable increase in linear range.

However, the necessary changes in the dimensions of the free layer are subject to technical limitations, in particular with regard to aspect ratio. By way of example, it is not possible to increase the layer thickness of the free layer as desired since, starting from a certain upper limit, the free layer is no longer able to be produced using methods that are customary at present. The reduction in the diameter is limited for example by lithography, and the risk of increased offset errors also increases.

To address this problem, magnetic shields are nowadays fitted above the free layer. Nickel-iron (NiFe) is usually used as the shielding material. These magnetic shields are plate-shaped and may consist of one or more plate-shaped shielding layers stacked on top of one another. This design brings about a linear stray field response to an external magnetic field. In other words, the plate-shaped shield, in response to the external field, generates a linear magnetic field the direction of which is counter to the direction of the external field.

In order to ensure effective shielding, the plate-shaped shielding layers have to be chosen to be thick enough that they will saturate later than the magnetoresistive sensor itself, that is to say the linear range of the magnetization of the shielding layers must be equal to or greater than the linear working range of the magnetoresistive sensor. For this reason, such conventional plate-shaped shields have a layer thickness of several micrometers.

However, this is accompanied by the problem that thicker shielding layers cause greater production costs. In addition, as the thickness of the shielding layers increases, there is an increased risk of delamination under the individual shielding layers.

SUMMARY

It is desirable to improve magnetic shields for magnetoresistive sensors such that the sensors exhibit linear behavior over a wide range without in the process exhibiting the abovementioned problems.

This objective is achieved by a magnetoresistive sensor having a shielding element that has a vortex magnetization in the basic state, together with the further features as claimed in the independent patent claim. Further implementations and advantageous aspects of this magnetoresistive sensor are specified in the respective dependent patent claims.

According to the innovative concept disclosed herein, what is proposed is a magnetoresistive sensor that has at least one magnetoresistive element having a layer stack, wherein the layer stack has at least one free layer. The free layer has a magnetization that is changeable in the layer plane and that varies depending on the field strength of an external magnetic field acting in the layer plane. The magnetization in the basic state, that is to say without an external magnetic field, may be oriented here either in the plane or perpendicular thereto. What is also proposed is a shielding element that has a vortex magnetization having a closed flux in the layer plane. The shielding element is configured, in the presence of the external magnetic field, to generate a linear magnetic stray field in the layer plane that is directed counter to the external magnetic field.

BRIEF DESCRIPTION OF THE DRAWINGS

Some example implementations are illustrated by way of example in the drawing and are explained below. In the figures.

DETAILED DESCRIPTION

In the following text, example implementations are described in more detail with reference to the figures, wherein elements having the same or a similar function are provided with the same reference signs.

Method steps that are illustrated or described in the context of the present disclosure may also be carried out in an order other than that illustrated or described. In addition, method steps relating to a particular feature of a device are interchangeable with that feature of the device, and this also applies the other way round.

The dimensions and sizes mentioned in the following description of the figures should be understood as being purely example. They are used only to give a rough insight as to the proportions in which the innovative concept described herein is implemented.

Where compensation is mentioned in the context of this disclosure, this may be understood to mean complete extinction, but also attenuation that has taken place to a certain extent. If for example compensation of an external magnetic field is mentioned in the context of this disclosure, then this may be understood to mean complete extinction of the external magnetic field, but also attenuation of the external magnetic field that has taken place to a certain extent.

Figure 1:
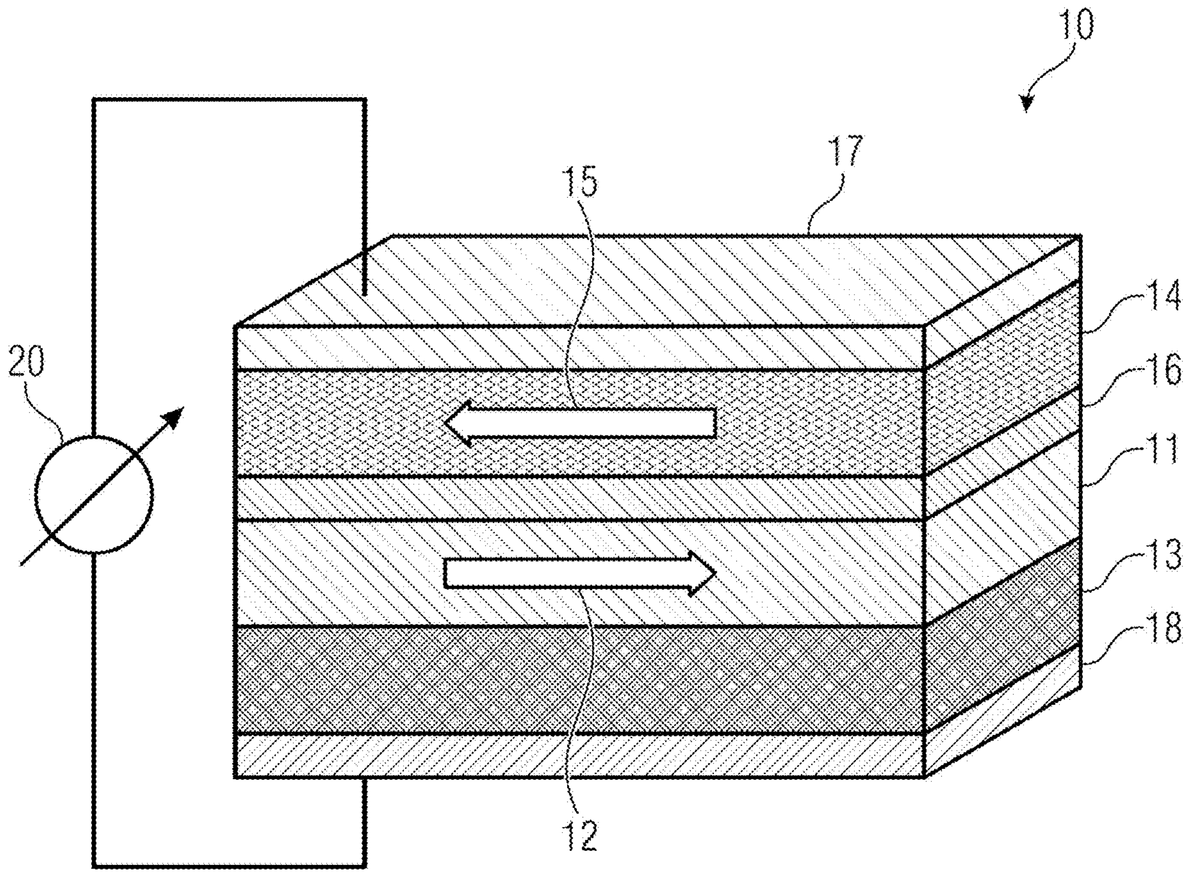
FIG. 1 shows a schematic perspective view of a magnetoresistive element as may be used in a magnetoresistive sensor according to one example implementation.

FIG. 1 first of all shows, as an introduction, the structure of a TMR layer stack or TMR stack 10 as one example of magnetoresistive sensors. The TMR stack 10 may also be referred to as a magnetic tunnel barrier or MTJ (magnetic tunnel junction). The TMR stack 10 has a ferromagnetic pinned layer 11, the magnetization direction 12 of which is defined by the underlying antiferromagnetic layer 13. Opposite this is arranged a ferromagnetic free layer 14, the magnetization direction 15 of which is not fixed, meaning that this is able to follow an external magnetic field. A tunnel barrier layer 16 is arranged between the free layer 14 and the pinned layer 11. Electrodes 17, 18 may be arranged on the outer surfaces of the TMS stack 10 and have a voltage 20 applied to them.

Both the free layer 14 and the pinned layer 11 are each magnetized in the layer plane and chip plane, respectively. The magnetization direction 15 of the free layer 14 may thus be rotated by an external magnetic field in the layer plane. The magnetic behavior of the free layer 14, in particular including in the case without an external magnetic field, depends on many factors, such as for example the material composition (that is to say saturation magnetization) or the geometry (for example thickness, shape and area) of the free layer 14, wherein certain geometries favor shape anisotropy in the free layer 14. By way of example, in long, thin bodies, the magnetization thereof aligns along the longitudinal axis in a preferred direction, which is also referred to as the "easy axis".

Due to the extremely low layer thickness, in the nanometer range, electrons are able to tunnel through the tunnel barrier 16 and bring about a flow of current through the TMR stack 10. The resistance or conductance of the TMR stack 10 is in this case determined by the angle between the magnetization directions 12, 15 of the fixed pinned layer 11 and of the free layer 14 able to move relative thereto, and is dependent on the direction and strength of the external magnetic field.

If for example the direction of the external magnetic field changes, then this brings about a change in the orientation of the magnetization 15 in the free layer 14. Depending on the orientation of the external field, the magnetization direction 15 of the free layer 14 may have parallel or anti-parallel field components with respect to the magnetization direction 12 of the pinned layer 11. An anti-parallel orientation of the magnetization 15 of the free layer 14 relative to the magnetization direction 12 of the pinned layer 11 (as shown in FIG. 1) leads to a high resistance or a low conductance, and a parallel orientation leads to a low overall resistance or large conductance of the TMR stack 10. Orientations between these two extremes then accordingly lead to overall resistances or conductances in between.

If the strength of an externally applied magnetic field is intended to be measured, the free layer 14 requires a restoring force that returns it to a defined magnetization state after the external magnetic field has been switched off. An increasingly strong external magnetic field will increasingly bring about a change in the magnetization state of the free layer 14 counter to the restoring force and thus a change in conductivity, which, in a certain magnetic field region, leads to a change in conductivity that is linear with the external magnetic field strength. Such a restoring force may be induced for example by an impressed magnetic anisotropy, such as a shape anisotropy. If for example this shape anisotropy is set in the x-direction (for example by a shape extended in an elongate manner in the x-direction), then it constitutes a restoring force counter to externally applied y-magnetic field components.

Under certain requirements with regard to shape, layer thickness and lateral dimension, vortex magnetization may also form in the free layer 14 as a stable basic state, as described in more detail below. One advantage of vortex magnetization is, inter alia, that it has a restoring force in any in-plane magnetic field directions.

Figure 2:
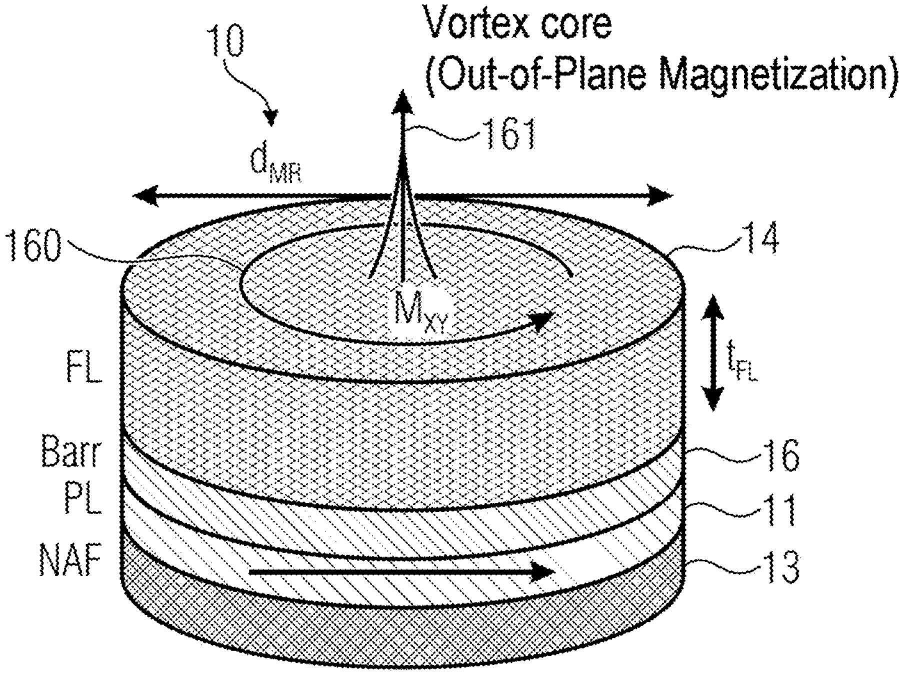
FIG. 2 shows a schematic perspective view of a magnetoresistive element with vortex magnetization, as may be used in a magnetoresistive sensor according to one example implementation.

FIG. 2 shows one example of a magnetoresistive element 10 with a vortex magnetization structure. Vortex magnetization is in-plane magnetization with a self-contained magnetic flux, which is symbolized here in the form of the circular arrow 160. One advantage of vortex magnetization is, inter alia, that remagnetization by external magnetic fields is largely hysteresis-free. Vortex magnetization forms in particular in structures with non-elongate geometry.

The magnetoresistive element 10 depicted here by way of example may for example have a substantially oval or circular cylindrical shape. The magnetoresistive element 10 may, in a manner similar to that explained above with reference to FIG. 1, have a pinned layer 11 (PL) the magnetization direction of which is defined by the underlying antiferromagnetic layer 13. A free layer 14 (FL), separated by a tunnel barrier layer 16, may be arranged above the pinned layer 11.

The magnetization direction of the free layer 14 is not fixed and is therefore able to follow the external magnetic field. Due to the round cylindrical shape, a substantially annular magnetization 160, which may also be referred to as vortex magnetization, is established in the free layer 14 in the starting state, that is to say in the absence of a prevailing external magnetic field. This annular vortex magnetization 160 forms in-plane, that is to say in the x-y plane, and has a self-contained magnetic flux. Within the annular vortex magnetization 160, an out-of-plane magnetic field component 161, that is to say a magnetic field component oriented in the z-direction, which is directed substantially perpendicular to the in-plane vortex magnetization 160, may be established.

The vortex structure has a high intrinsic anisotropy, which is also referred to as shape anisotropy. Under certain constraints, the vortex magnetization state may be a preferred state of energy that is repeatedly adopted after applying and switching off an external magnetic field. This corresponds to an intrinsic restoring force of the free layer that makes it possible to measure a field strength of an externally applied magnetic field.

As may be seen in FIG. 2, the free layer 14 has a diameter $d_{MR}$ and a layer thickness $t_{FL}$. The restoring force may be influenced by varying the diameter $d_{MR}$ and/or the layer thickness $t_{FL}$. Magnetoresistive sensors with a high restoring force have a large linear working range. In principle, a linear working range is highly desirable for magnetoresistive sensors.

Figure 3A:
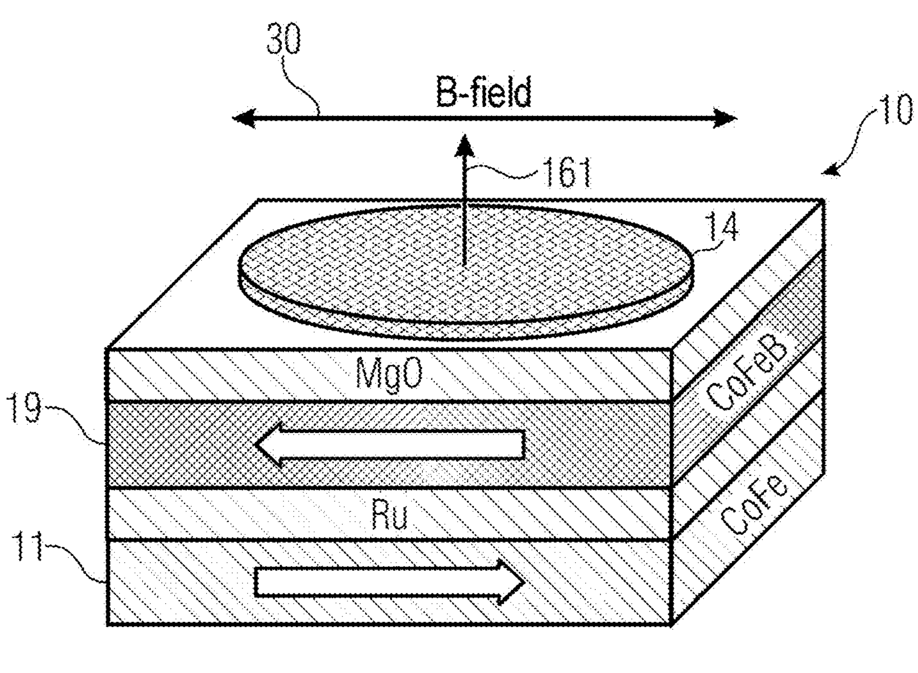
FIG. 3A shows a schematic perspective view of a magnetoresistive element having a free layer with vertical magnetization, as may be used in a magnetoresistive sensor according to one example implementation.

FIGS. 3A and 3B and 4A and 4B show examples of how the linear working range of a magnetoresistive element is able to be influenced based on the dimensions of the free layer 14. FIG. 3A shows a magnetoresistive element 10 having a pinned layer 11 and a free layer 14. In addition to the structures discussed so far, the magnetoresistive element 10 illustrated here has a fixed reference layer 19 directed counter to the pinned layer 11. The free layer 14 is circular and may have an abovementioned out-of-plane magnetic field component 161. The externally prevailing magnetic field 30 to be determined is oriented in-plane, that is to say in the same plane as the magnetizations of the individual layers 11, 14, 19.

Figure 3B:
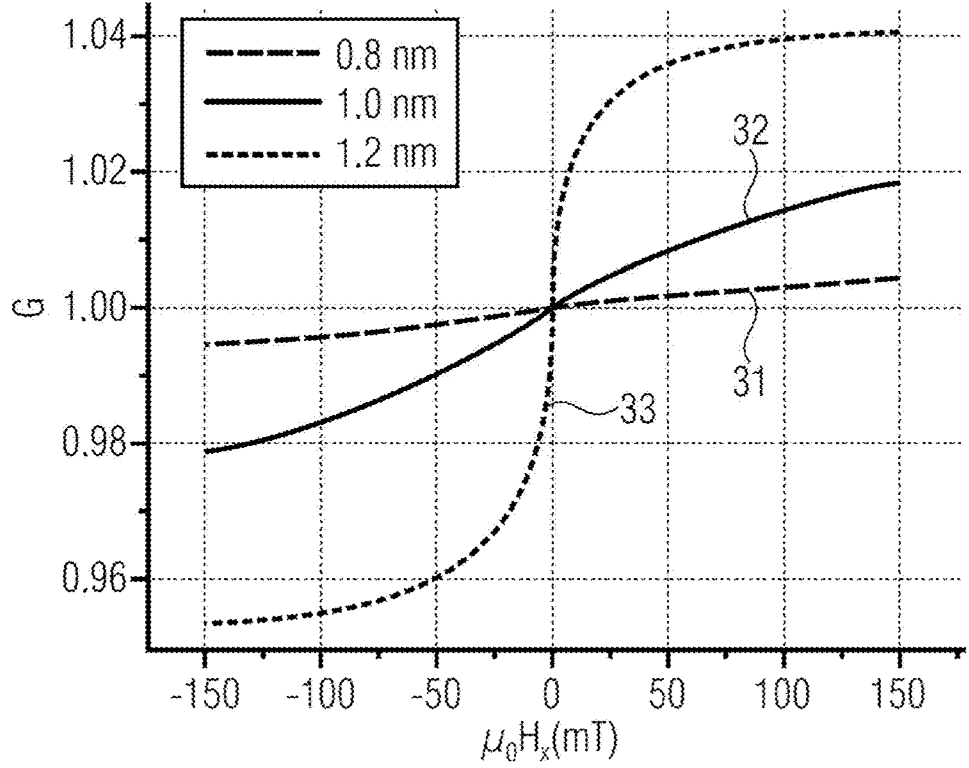
FIG. 3B shows characteristic curves of free layers of different layer thicknesses.

FIG. 3B shows the associated working range diagram in which the change in the conductance G of the magnetoresistive element 10 (y-axis) is plotted as a function of the magnetic field strength (x-axis) of the external magnetic field 30. The curve 31 here shows, purely by way of example, the working range of a magnetoresistive element 10 having a free layer 14 that has a layer thickness of 0.8 nm. In the case of very thin layers, the magnetization in the basic state may point perpendicular to the layer plane, with this effect also being referred to as interface anisotropy. The curve 32 shows, by way of example, the working range of a magnetoresistive element 10 having a free layer 14 that has a layer thickness of 1.0 nm. The curve 33 shows, by way of example, the working range of a magnetoresistive element 10 having a free layer 14 that has a layer thickness of 1.2 nm.

As may generally be seen initially here, a change in conductance in the case of low layer thicknesses of the free layer 14 is likewise only very small, that is to say the sensitivity of the sensor is only very low. Although an increase in the layer thickness leads to a greater change in conductance and thus to increased sensitivity, a larger layer thickness also leads at the same time to a significantly restricted linear working range of the sensor. Even in the case of a layer thickness of only 1.2 nm, the linear working range of the sensor still extends only within a limited range of ±20 mT.

Figure 4A:
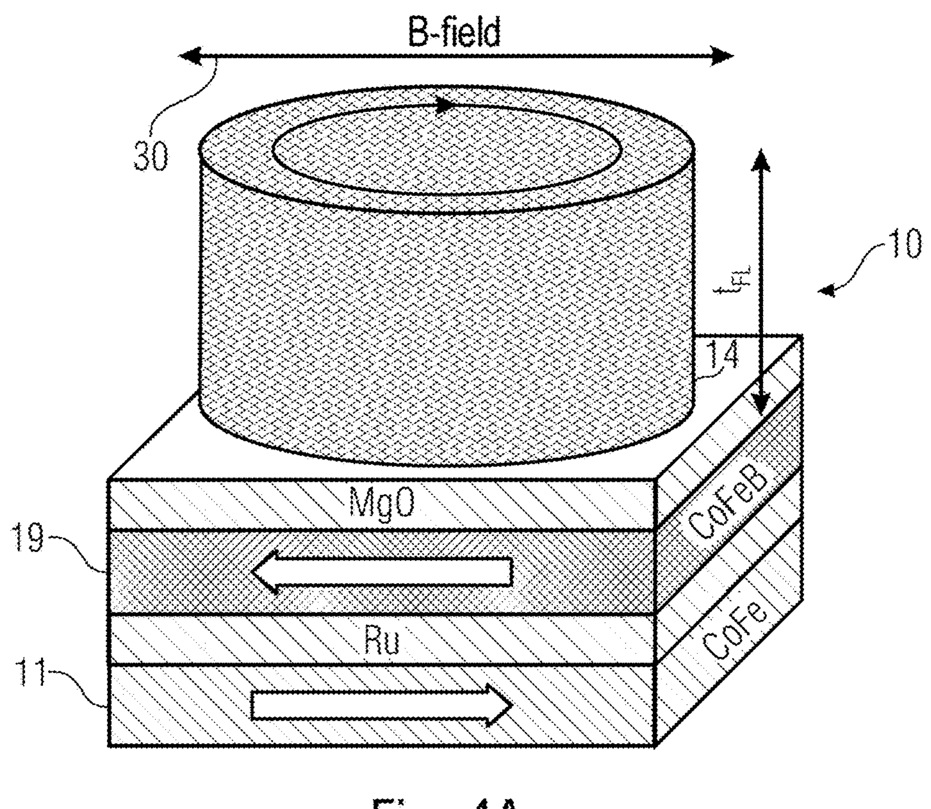
FIG. 4A shows a schematic perspective view of a magnetoresistive element having a free layer with vortex magnetization, as may be used in a magnetoresistive sensor according to one example implementation.

As mentioned at the outset, the sensitivity and bandwidth of the sensor within which the sensor exhibits linear behavior may be influenced by increasing the aspect ratio (layer thickness/diameter) of the free layer 14. FIG. 4A shows, purely by way of example, a free layer 14 that has a significantly greater layer thickness $t_{FL}$ than the free layer 14 described above with reference to FIG. 3A, with otherwise the same diameter.

Figure 4B:
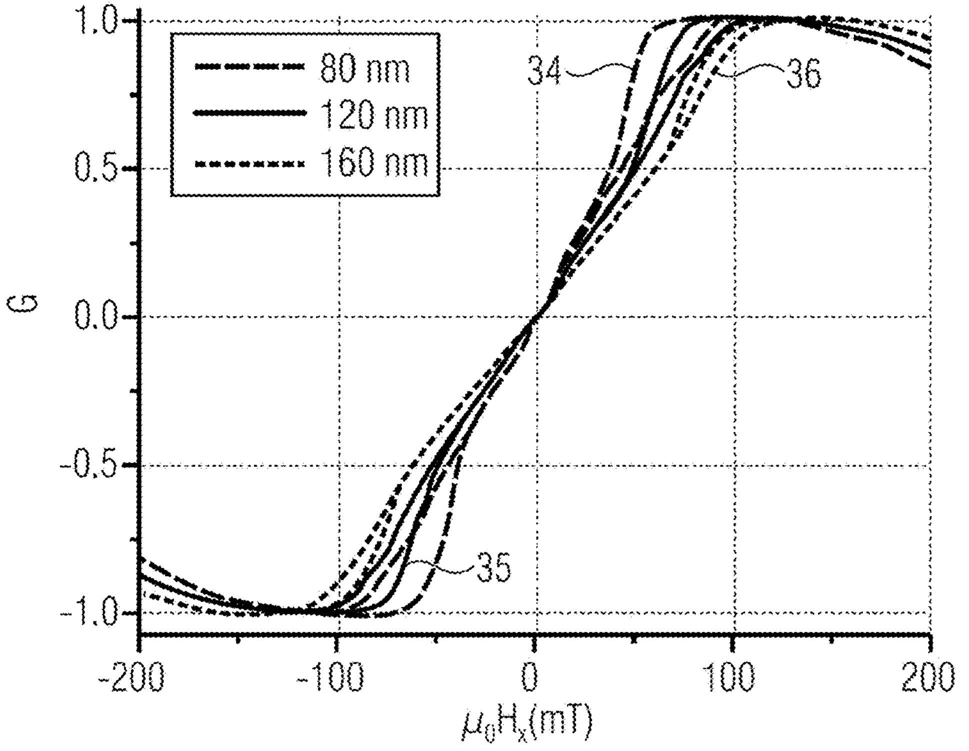
FIG. 4B shows characteristic curves of free layers of different layer thicknesses.

FIG. 4B shows the associated working range diagram in which the change in the conductance G of the magnetoresistive element 10 (y-axis) is plotted as a function of the magnetic field strength (x-axis) of the external magnetic field 30. The curve 34 shows, by way of example, the working range of a magnetoresistive element 10 having a free layer 14 that has a layer thickness of 80 nm. The curve 35 shows, by way of example, the working range of a magnetoresistive element 10 having a free layer 14 that has a layer thickness of 120 nm. The curve 36 shows, by way of example, the working range of a magnetoresistive element 10 having a free layer 14 that has a layer thickness of 160 nm.

The range of the change in conductance (y-axis) is significantly greater, thereby making it possible to significantly increase the sensitivity of the sensor. The linear working range (x-axis) is also significantly greater than before. The sensor here has a linear working range between −100 mT and +100 mT.

The larger the aspect ratio (layer thickness/diameter) of the free layer 14 of a sensor, the larger the external magnetic fields 30 able to be measured with such a sensor. However, such an increase in the aspect ratio (thickness/diameter) of the free layer 14 is subject to technical limitations.

Figure 5:
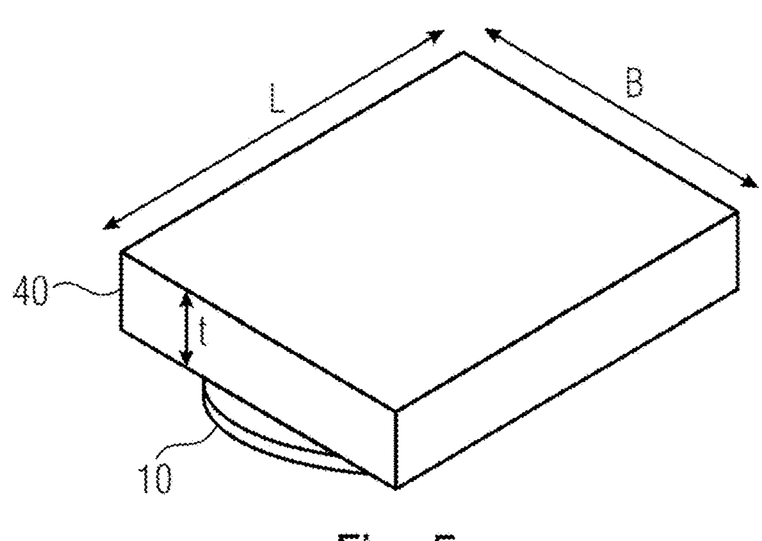
FIG. 5 shows a perspective view of a conventional magnetic shield in the form of a plate-shaped element.

In order nevertheless to enable a sensor with a large linear working range, magnetic shields are nowadays fitted above the magnetoresistive elements 10. FIG. 5 shows one example of such a conventional magnetic shield.

FIG. 5 shows a TMR element 10 and a plate-shaped magnetic shielding element 40 arranged above the TMR element 10. The magnetic shielding element 40 may for example have a length L of roughly 100 μm, a width B of approximately 20 μm and a thickness t of approximately 10 μm.

Nickel-iron (NiFe) in various alloys is usually used as material for the shield 40. The permalloy alloy (Ni81Fe19), for example, is magnetically very soft and exhibits very low magnetic hysteresis. An alloy (Ni50Fe50) has a very high saturation magnetization. The plate-like shape of the shielding element 40 brings about a linear stray field response to the external magnetic field. In other words, the plate-shaped shielding element 40, in response to an external magnetic field 30, generates a linear stray field the direction of which is directed counter to the direction of the external magnetic field.

To ensure effective shielding, the plate-shaped shielding element 40 should be chosen to be thick enough that it will saturate later than the TMR element 10 itself, that is to say the linear range of the magnetization of the shielding element 40 must be greater than the linear working range of the TMR element 10. For this reason, such conventional plate-shaped shields 40 have a thickness of several micrometers.

However, this is accompanied by the problem that thicker shielding elements 40 cause greater production costs. As the thickness of the shielding element 40 increases, there may be an increased risk of delamination between adjacent layers.

The innovative concept described herein provides a solution to these problems by providing a shielding element with vortex magnetization. The shielding element is arranged below or above the free layer of a magnetoresistive element and shields the free layer from external magnetic fields. The vortex magnetization exhibits linear magnetization behavior over a wide range, with even very thin layers being sufficient to be able to generate effective vortex magnetization. The layer thicknesses may be in the range of a few nanometers, meaning that the vortex shielding elements are able to be configured to be much thinner than conventional plate-shaped shields, with comparable shielding performance.

Figure 6:
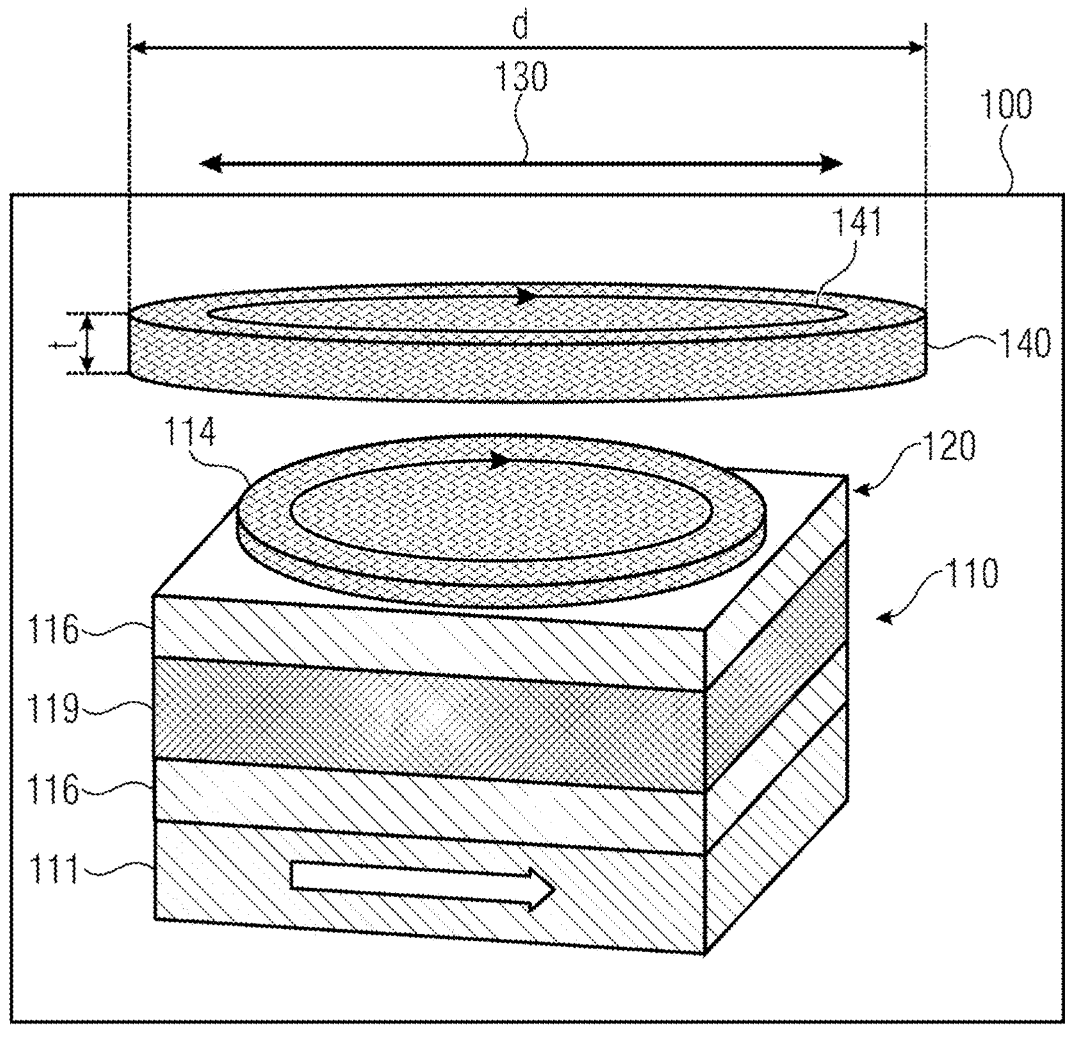
FIG. 6 shows a schematic perspective view of a magnetoresistive element together with a vortex shielding element according to one example implementation.

FIG. 6 shows a schematic perspective view of a magnetoresistive sensor 100 according to one example implementation. The magnetoresistive sensor 100 has at least one magnetoresistive element 110. The magnetoresistive element 110 corresponds essentially to the magnetoresistive elements 10 discussed above with reference to the previous figures.

The magnetoresistive element 110 has a layer stack 120 having at least one free layer 114. As has already been described in detail at the outset, the free layer 114 has a magnetization that is changeable in the layer plane and that varies depending on the field strength of an external magnetic field 130 acting in the layer plane.

In the non-limiting example implementation shown here, the free layer 114 is circular, meaning that vortex magnetization is generated in the free layer 114 due to the shape anisotropy. This would correspond essentially to the implementations of the free layer 14 discussed above with reference to FIGS. 3A and 4A. The free layer 114 may be configured for example in the shape of a circular disk, the diameter of which is at least as great as its thickness. As an alternative, the free layer 114 may be configured in the shape of a cylinder, the diameter of which is smaller than its thickness.

It would however also be conceivable for the free layer 114 to be configured in the shape of an elongate element in which precisely no vortex magnetization is formed. Instead, the magnetization would then decompose into domains that, in the presence of an external magnetic field, would align in the direction of the external field, such that a mean magnetization direction of the free layer 114 is established in the field direction. This would in turn correspond essentially to the implementations of the free layer 14 discussed above with reference to FIG. 1.

According to the innovative concept disclosed herein, the magnetoresistive sensor 100 has a shielding element 140. The shielding element 140 may contain a ferromagnetic material or consist of a ferromagnetic material. The shielding element 140 has a vortex magnetization 141 with a closed flux in the layer plane. The vortex magnetization 141 is an essentially annular or circular in-plane magnetization.

For this purpose, the shielding element 140 may have a geometric shape that is configured to generate the vortex magnetization 141 in the shielding element 140. By way of example, the shielding element 140 may have a non-elongate, for example round, oval or circular outer contour.

In the non-limiting example illustrated here, the shielding element 140 is configured in the shape of a circular disk, the diameter d of which is at least as great as its thickness t. As an alternative, the shielding element 140 could however also be configured in the shape of a cylinder, the diameter d of which is smaller than its thickness t. The diameter d is measured parallel to the layer plane, and the thickness t is measured orthogonal to the layer plane.

The following should be stated with regard to the layer plane: The layer stack 120 has multiple layers arranged above one another, for example a pinned layer 111, a reference layer 119, a free layer 114 and optionally one or more intermediate layers 116. The individual layers 111, 114, 116, 119 each extend within a layer plane, for example horizontally. Within the layer stack 120, the individual layers 111, 114, 116, 119 are stacked above one another in a direction perpendicular to the layer plane, for example in a vertical direction. A direction parallel to the layer plane may also be referred to as in-plane, while a direction perpendicular to the layer plane may also be referred to as out-of-plane.

As may also be seen in FIG. 6, the shielding element 140 is arranged opposite the free layer 114 in the direction perpendicular to the layer plane. The shielding element 140 may accordingly thus be arranged for example above or below the free layer 114 or the magnetoresistive element 110. Example implementations in this regard are explained below with reference to FIGS. 11 to 15.

Figure 7:
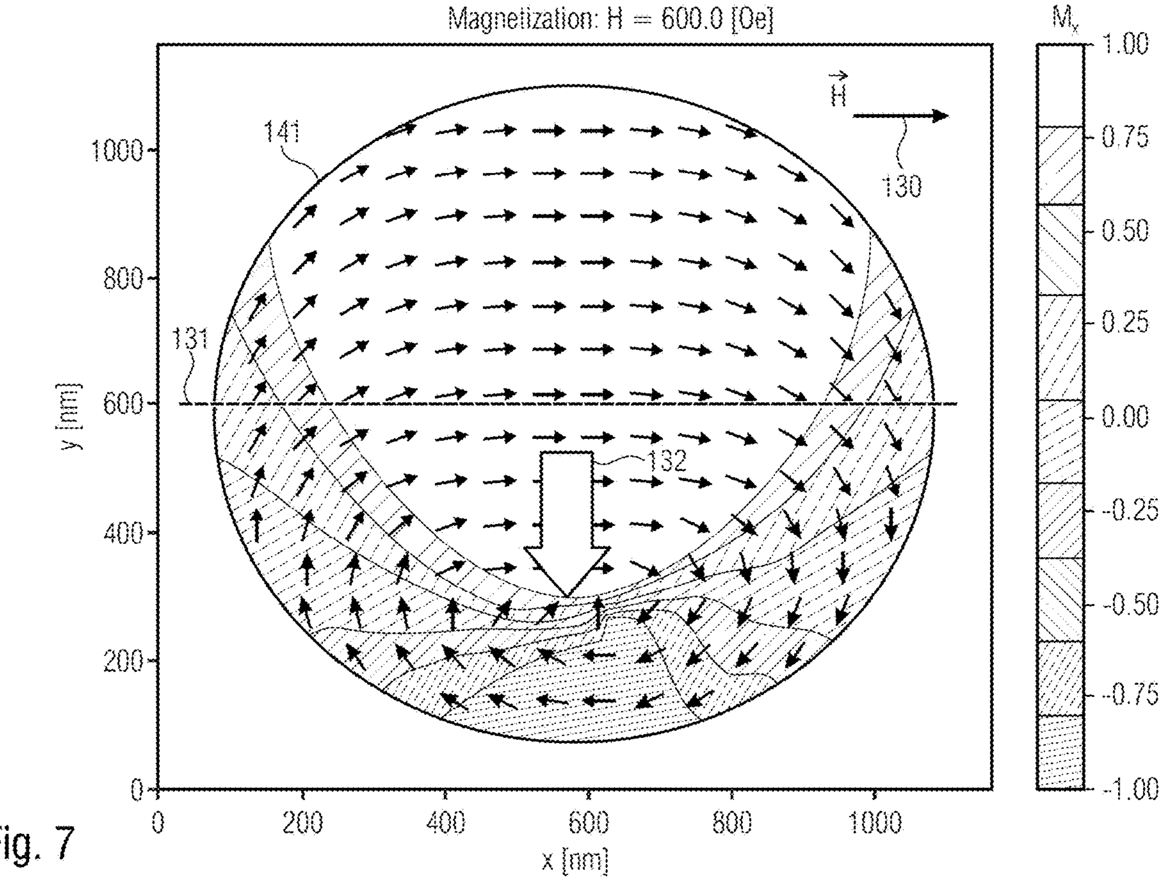
FIG. 7 shows one example of a shift of the magnetization within a vortex element in response to an external magnetic field.

First of all, however, FIG. 7 shows, by way of example, the shifting of a vortex magnetization within a shielding element 140 in the presence of an external magnetic field 130. In a starting state (not illustrated here), that is to say without the presence of an external magnetic field 130, the vortex magnetization 141 is initially in equilibrium. Here, the magnetic field lines (represented by the small arrows within the shielding element 140) are formed uniformly and concentrically within the shielding element 140.

However, in the presence of an external magnetic field 130, as illustrated by way of example in FIG. 7, the magnetic field lines within the shielding element 140 shift away from the center 131 (represented by the arrow 132), toward a direction dependent on the direction of the external magnetic field 130. In the example shown in FIG. 7, the external magnetic field 130 acts for example to the right, and the vortex core within the shielding element 140 shifts downward orthogonally thereto. The magnetization within the structure is effectively oriented here in the direction of the external magnetic field 130 (here for example from left to right). An overall magnetization thus points in the direction of the external field 130. As a result, magnetic poles form within the structure on the left and right, these in turn generating an opposing field outside the structure that is directed counter to the magnetic field 130 (here for example from right to left).

Figure 8:
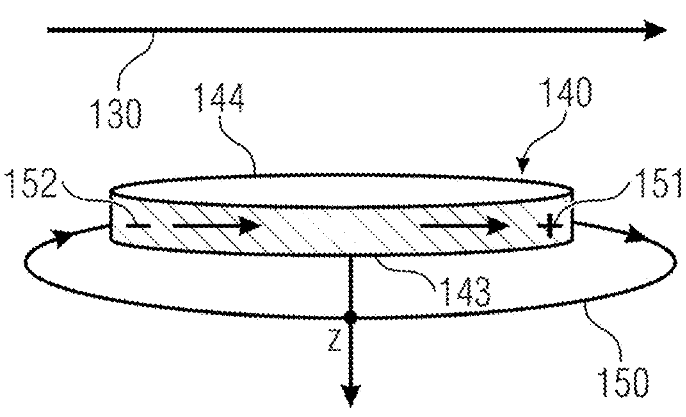
FIG. 8 shows a schematic view of a vortex shielding element according to one example implementation.

This is illustrated schematically in FIG. 8. The shielding element 140, in response to an external magnetic field 130, generates a magnetic stray field 150 that extends from a magnetic positive pole 151 to a magnetic negative pole 152. This magnetic stray field 150 changes linearly with the external magnetic field 130 in terms of magnitude and direction. By way of example, the stray field 150 may increase linearly with the external magnetic field 130, and do so until the shielding element 140 saturates.

Opposite the two main surfaces 143, 144 (for example top and bottom), running parallel to the layer plane, of the shielding element 140, the stray field 150 generated by the shielding element 140 is directed counter to the external magnetic field 130. The stray field 150 generated by the shielding element 140 may thereby at least partially compensate for or attenuate the external magnetic field 130.

Figure 9A:
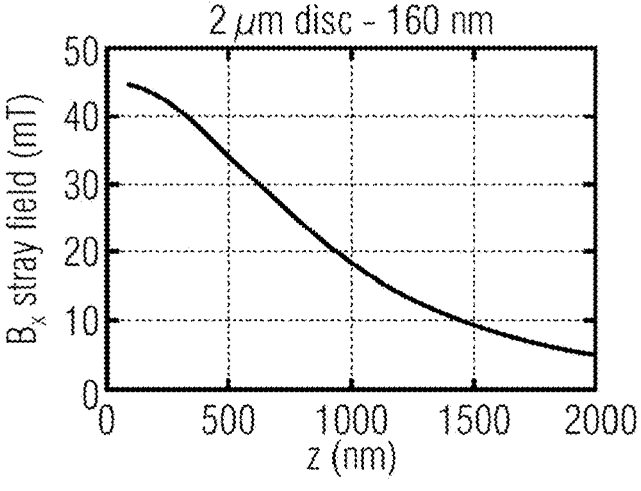
FIG. 9A shows a characteristic curve of a vortex shielding element according to one example implementation.
Figure 9B:
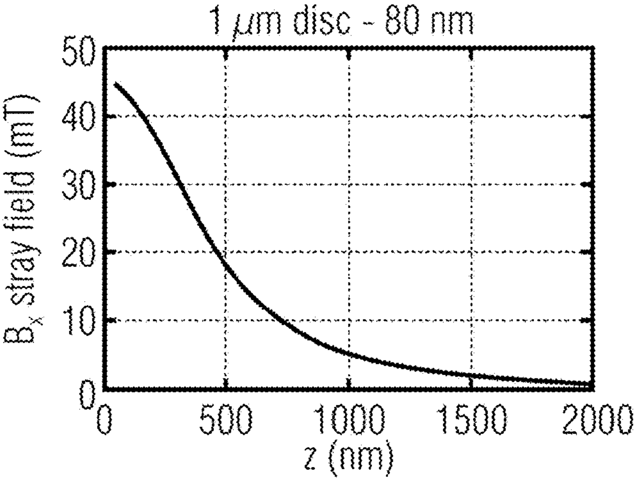
FIG. 9B shows a characteristic curve of a vortex shielding element with different dimensions according to one example implementation.

In FIGS. 9A and 9B, a profile of the magnetic field strength of the stray field 150 is plotted in each case as a function of distance in the z-direction (orthogonal to the layer plane). In FIG. 9A, this is shown using the example of a shielding element 140 with a diameter of 2 μm and a layer thickness of 160 nm, that is to say the shielding element 140 in this example has an aspect ratio (layer thickness/diameter) of 160:2000=4:50. FIG. 9B shows, for comparison, the profile of the magnetic field strength of a shielding element 140 with a diameter of 1 μm and a layer thickness of 80 nm, that is to say, although the shielding element 140 has smaller overall dimensions, the aspect ratio (layer thickness/diameter) remains the same, that is to say, in this case too, the shielding element 140 has an aspect ratio of 80:1000=4:50.

In both cases, the aspect ratio (layer thickness/diameter) of the respective shielding element 140 is thus the same. In the first example case (FIG. 9A), however, the shielding element is larger and thicker in terms of absolute values (twice as large and thick) than the shielding element in the second example case (FIG. 9B).

As may be seen in each of FIGS. 9A and 9B, in both cases, the magnetic field strength is greatest in the immediate vicinity of the shielding element 140 (at $z \approx 0$). However, whereas, in the larger shielding element according to FIG. 9A, a measurable magnetic field strength of approximately 10 mT is still present at a distance of around 1500 nm, in the smaller shielding element according to FIG. 9B, on the other hand, the magnetic field strength has already almost completely decayed at a distance of 1500 nm. It thus becomes clear that the decrease in the stray field 150 is less as the distance z increases, the larger the shielding element 140 (with otherwise the same aspect ratio).

In principle, the stray field 150 able to be generated by the shielding element 140 becomes larger the greater the layer thickness t of the shielding element 140. The stray field 150 increases linearly here as the layer thickness t increases. On the other hand, however, an increase in the diameter d of the shielding element 140 brings about a reduction in the stray field 150.

In the non-limiting examples according to FIGS. 9A and 9B, the double aspect ratio was selected. This initially leads to an equally large stray field 150 in the vicinity. The maximum stray field 150 able to be generated in the immediate vicinity of the shielding element 140 is thus the same in both cases, which is due to the fact that the two aspect ratios are the same. However, the difference is that the stray field 150 in the case of the larger shielding element 140 decays more slowly as the vertical distance z increases. The shielding element 140 may thus be arranged at a greater distance from the magnetoresistive element 110.

The aspect ratio (layer thickness/diameter) of the shielding element 140 is thus primarily decisive for the maximum stray field 150 able to be generated in the vicinity. By way of example, it may be determined according to the following formula:

$$H_{stray} \approx -8M_s \frac{t}{d},$$

Here, $H_{stray}$ represents the magnetic field strength of the stray field 150, $M_s$ is a material-specific property and denotes the saturation magnetization of the shielding element 140, t denotes the layer thickness of the shielding element 140, and d denotes the diameter of the shielding element 140.

As may be seen in the above formula, the aspect ratio of the layer thickness/diameter of the shielding element 140 is decisive for the maximum stray field 150 able to be generated by way of the shielding element 140. The maximum stray field 150 able to be generated here also defines the linear range of the shielding element 140. In other words, as the aspect ratio increases (for example due to an increasing layer thickness), the shielding factor of the shielding element 140 does not increase, but rather the maximum stray field 150 able to be generated and thus the linear range of the shielding element 140 increase. The aspect ratio is thus responsible for the linear shielding range of the shielding element 140. The strength of the shielding (corresponds to the decay behavior of the shielding effect as distance increases) may on the other hand be increased by increasing the layer thickness t and the diameter d each by the same factor (for example 2t/2d) while maintaining the aspect ratio.

In order to generate a sufficiently large stray field 150, a layer thickness of around 100 nm may already be sufficient, based on a shielding element 140 having a diameter of 1 μm. Implementations make provision for the shielding element 140 to have a layer thickness between 50 nm and 500 nm. This is significantly thinner than the plate-shaped shields 40 used up to now, as were described above with reference to FIG. 5. These plate-shaped shields 40 have layer thicknesses between 10 μm and 100 μm. The vortex concept according to the implementation thus makes it possible to achieve a 200-fold reduction. As a result, the innovative shielding elements 140 described herein are able to be integrated significantly more easily using conventional microstructuring processes, and there is no risk of delamination.

As mentioned above, the magnetic field strength of the stray field 150 able to be generated depends, inter alia, on the dimensions, and in particular here on the aspect ratio, of the shielding element 140. The compensation rate of the shielding element 140, that is to say the extent to which the respective shielding element 140 is able to attenuate or compensate for the external magnetic field 130, may thus also be adjusted accordingly. Accordingly, the dimensions to be selected of the shielding element 140 depend, inter alia, on the magnetic field strength of the external magnetic field 130 and its desired compensation.

Figure 10A:
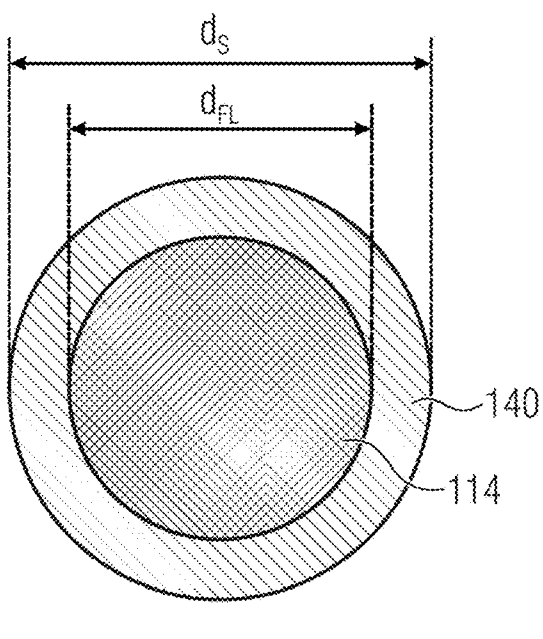
FIGS. 10A-10C show schematic plan views of a free layer and a vortex shielding element arranged above or below it, according to example implementations.
Figure 10B:
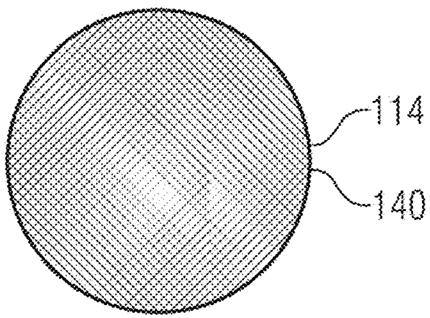
Figure 10C:
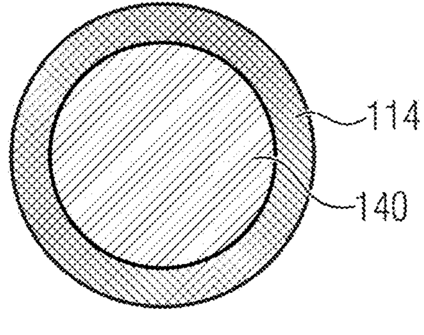

FIGS. 10A to 10C each show plan views, orthogonal to the layer plane, of a free layer 114 and a shielding element 140. In this non-limiting example, they are both circular in each case. FIG. 10A shows that the diameter $d_s$ of the shielding element 140 is greater than the diameter $d_{FL}$ of the free layer 114. As a result, the shielding element 140 overlaps the free layer 114 beyond its edge.

FIG. 10B shows that the diameter $d_s$ of the shielding element 140 is roughly the same size as the diameter $d_{FL}$ of the free layer 114. As a result, the shielding element 140 overlaps the free layer 114 exactly or without any edges.

FIG. 10C shows a further conceivable example implementation, wherein the diameter $d_s$ of the shielding element 140 is smaller than the diameter $d_{FL}$ of the free layer 114. As a result, the free layer 114 overlaps the shielding element 140. Depending on the desired shielding effect, this design may also be sufficient to shield the free layer 114 against an external magnetic field 130 by way of a vortex shielding element 140.

However, it should also be noted again at this juncture that the maximum stray field 150 able to be generated, which defines the linear range of the shielding element 140, is determined via the aspect ratio of the shielding element 140. In other words, the aspect ratio determines the linear magnetic field range for which the shielding element 140 is able to partially or fully compensate. The range of the stray field 150 (decrease with distance z) along with the homogeneity of the shielding may be adjusted by increasing the dimensions (for example increasing the layer thickness and the diameter each by the same factor) of the shielding element 140, with the aspect ratio remaining the same.

As mentioned above with reference to FIGS. 9A and 9B, the vertical distance between the shielding element 140 and the magnetoresistive element 110 also plays a role. In principle, the stray field 150 able to be generated by a vortex shielding element 140 decays rapidly as distance increases. Conversely, however, this also means that the stray field 150 is very large in the immediate vicinity of the magnetoresistive element 110. Therefore, implementations may make provision for the shielding element 140 to directly adjoin the magnetoresistive element 110 or to be in direct contact therewith.

Alternative example implementations, on the other hand, make provision to provide a certain distance between the shielding element 140 and the magnetoresistive element 110. This distance may depend, inter alia, on the layer thickness t and/or the diameter d of the shielding element 140. By way of example, the distance between the shielding element 140 and the magnetoresistive element 110 may be roughly 0.1 to 1 times as great as the diameter d of the shielding element 140.

Such a distance may be provided for example by arranging a correspondingly thick dielectric, or else also electrically conductive, layer between the shielding element 140 and the magnetoresistive element 110. Such layers may for example be produced in high-precision layer thicknesses using common deposition methods, which allows high-accuracy adjustment of the distance between the magnetoresistive element 110 and the shielding element 140.

As already mentioned at the outset, the vortex shielding element 140 may in principle be arranged below or above a magnetoresistive element 110. More generally speaking, the shielding element 140, seen in a direction perpendicular to the layer plane, may be arranged opposite the magnetoresistive element 110.

Figure 11:
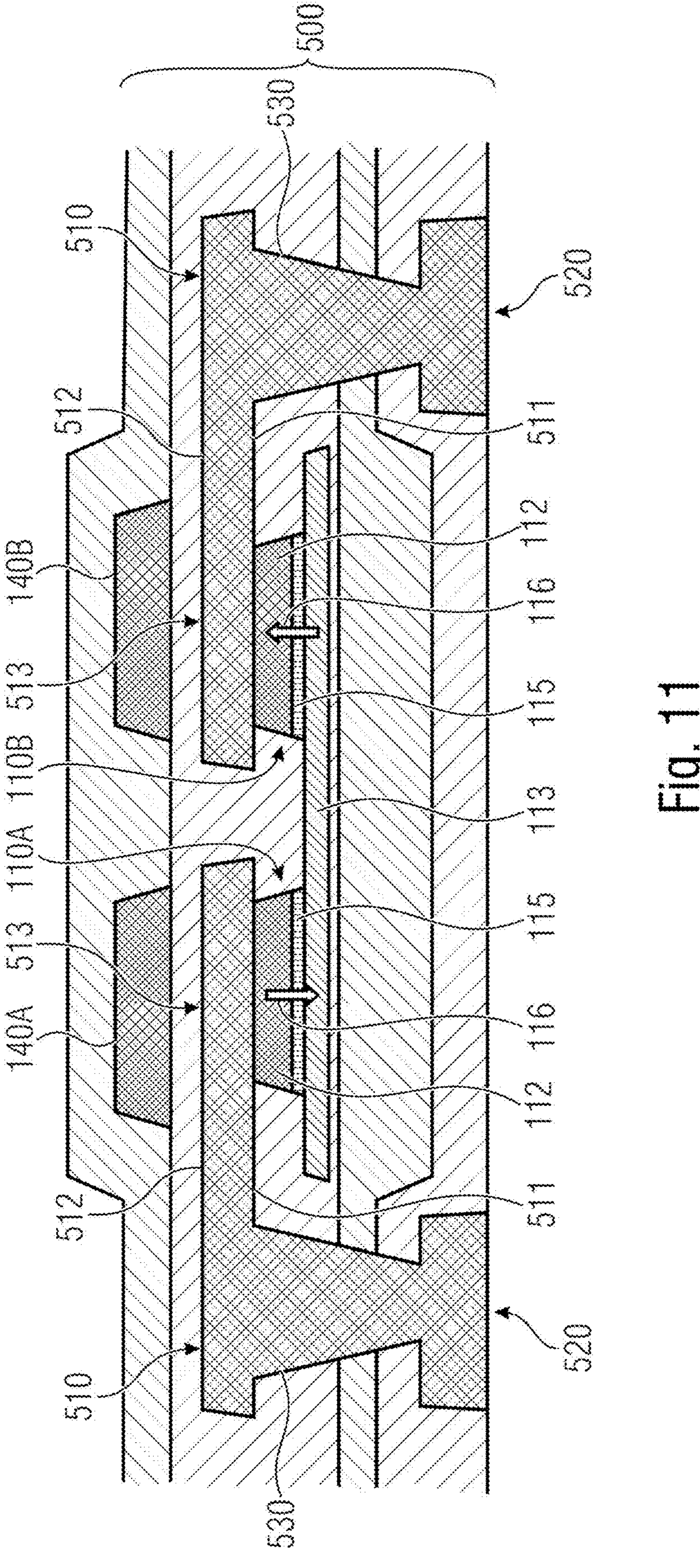
FIG. 11 shows a schematic sectional view of a multi-layer substrate having two integrated magnetoresistive elements and two vortex shielding elements arranged above it, according to one example implementation.
Figure 12:
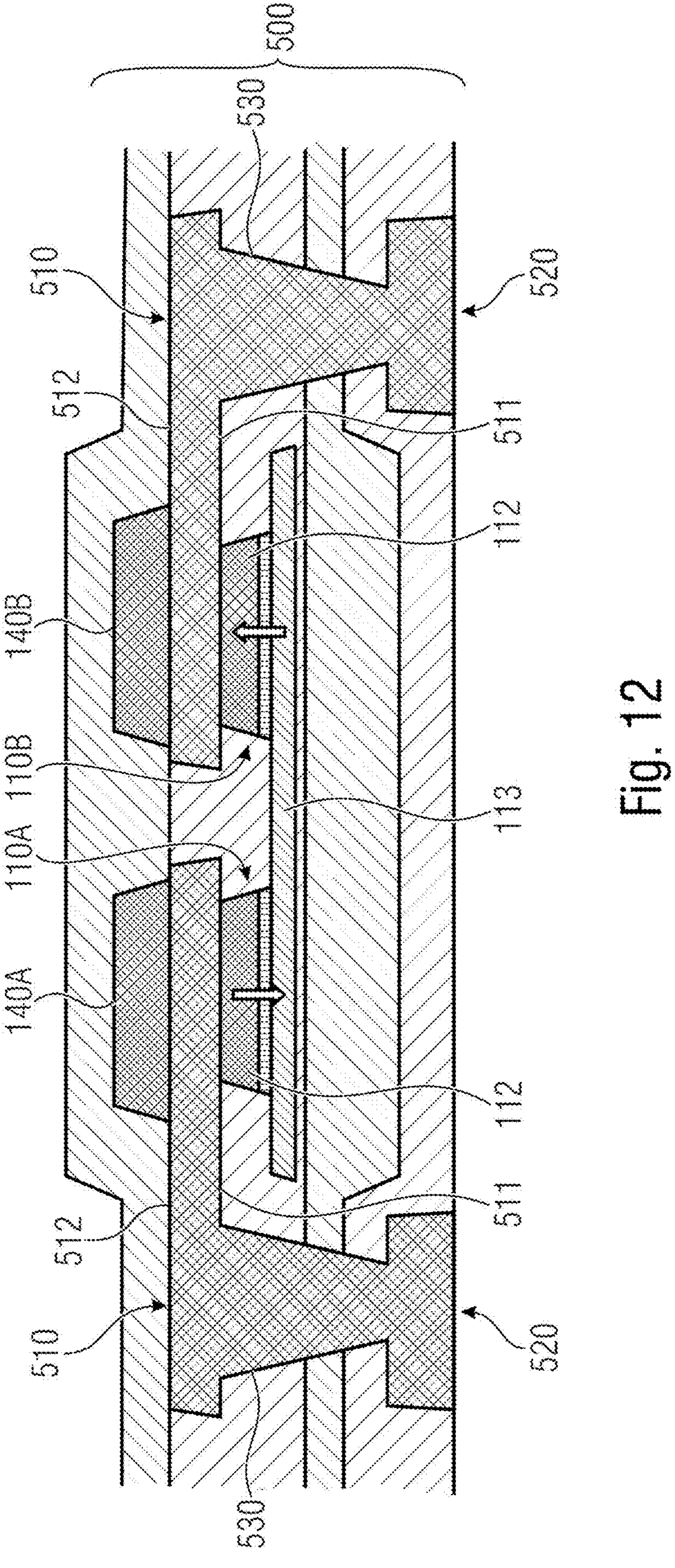
FIG. 12 shows a schematic sectional view of a multi-layer substrate having two integrated magnetoresistive elements and two vortex shielding elements arranged above it, according to a further example implementation.

FIGS. 11 and 12 show conceivable implementations in which the shielding element 140 is arranged above the magnetoresistive element 110. Shown here, purely by way of example, are in each case two magnetoresistive elements 110A, 110B that are each able to be shielded against an external magnetic field by a shielding element 140A, 140B.

A substrate 500 is provided as part of the innovative magnetoresistive sensor 100. The substrate 500 may be configured for example as a multi-layer substrate, wherein the shielding element 140 may be integrated into at least one layer of the multi-layer substrate. The shielding element 140 and the magnetoresistive element 110 may in principle each be integrated into different layers of the multi-layer substrate 500. However, it would also be conceivable for the shielding element 140 and the magnetoresistive element 110 each to be integrated into one and the same layer of the multi-layer substrate 500.

In the non-limiting example implementations illustrated here, the multi-layer substrate 500 has at least one metallization layer 510. The metallization layer 510 may also be referred to as a top metal and forms a metal contact for making contact with the magnetoresistive elements 110A, 110B. For this purpose, the magnetoresistive elements 110A, 110B may be galvanically coupled to the metallization layer 510.

For this purpose, the magnetoresistive elements 110A, 110B may either be arranged directly on the metallization layer 510 and galvanically coupled thereto, or the magnetoresistive elements 110A, 110B could be spaced at a distance from the metallization layer 510 and galvanically coupled to the metallization layer 510 by way of an electrode structure or a plated through-hole (via, not illustrated here).

As illustrated by way of example in FIG. 11, the magnetoresistive elements 110A, 110B may be coupled to the metallization layer 510 by way of an upper electrode structure 112, which may also be referred to as a top electrode. A lower electrode structure 113, which may also be referred to as a bottom electrode, may electrically connect the individual magnetoresistive elements 110A, 110B to one another. Reference sign 115 references a schematically indicated tunnel barrier, which symbolizes the actual layer stack including the free layer (not discernible here). The arrows referenced with reference sign 116 symbolize a possible current flow direction.

In addition to the top metal metallization layer 510, provision may be made for a further metallization layer 520, which may also be referred to as a bottom metal. The two metallization layers 510, 520 may be galvanically connected to one another by way of a vertical plated through-hole (via) 530. The magnetoresistive elements 110A, 110B may thus be contacted from the bottom.

In this non-limiting example implementation, the magnetoresistive elements 110A, 110B each face a first surface 511, for example the bottom, of the metallization layer 510. The shielding elements 140A, 140B, on the other hand, face an opposite second surface 512, for example the top, of the metallization layer 510. Accordingly, the metallization layer 510 may thus be arranged between the magnetoresistive elements 110A, 110B and the shielding elements 140A, 140B.

As may be seen in FIGS. 11 and 12, the magnetoresistive elements 110A, 110B and the shielding elements 140A, 140B may each be arranged opposite one another in the vertical direction, such that a respective magnetoresistive element 110A, 110B and a shielding element 140A, 140B overlap, seen in a plan view.

In the example implementation shown in FIG. 11, a dielectric layer 513 may optionally be arranged between the shielding elements 140A, 140B and the second surface 512 of the metallization layer 510. The shielding elements 140A, 140B may thereby be electrically or galvanically isolated from the metallization layer 510.

In the example implementation illustrated in FIG. 12, the shielding elements 140A, 140B are on the other hand arranged directly on the second surface 512 of the metallization layer 510 and in contact with the metallization layer 510. The shielding elements 140A, 140B may in this case be electrically or galvanically coupled to the metallization layer 510.

Figure 13:
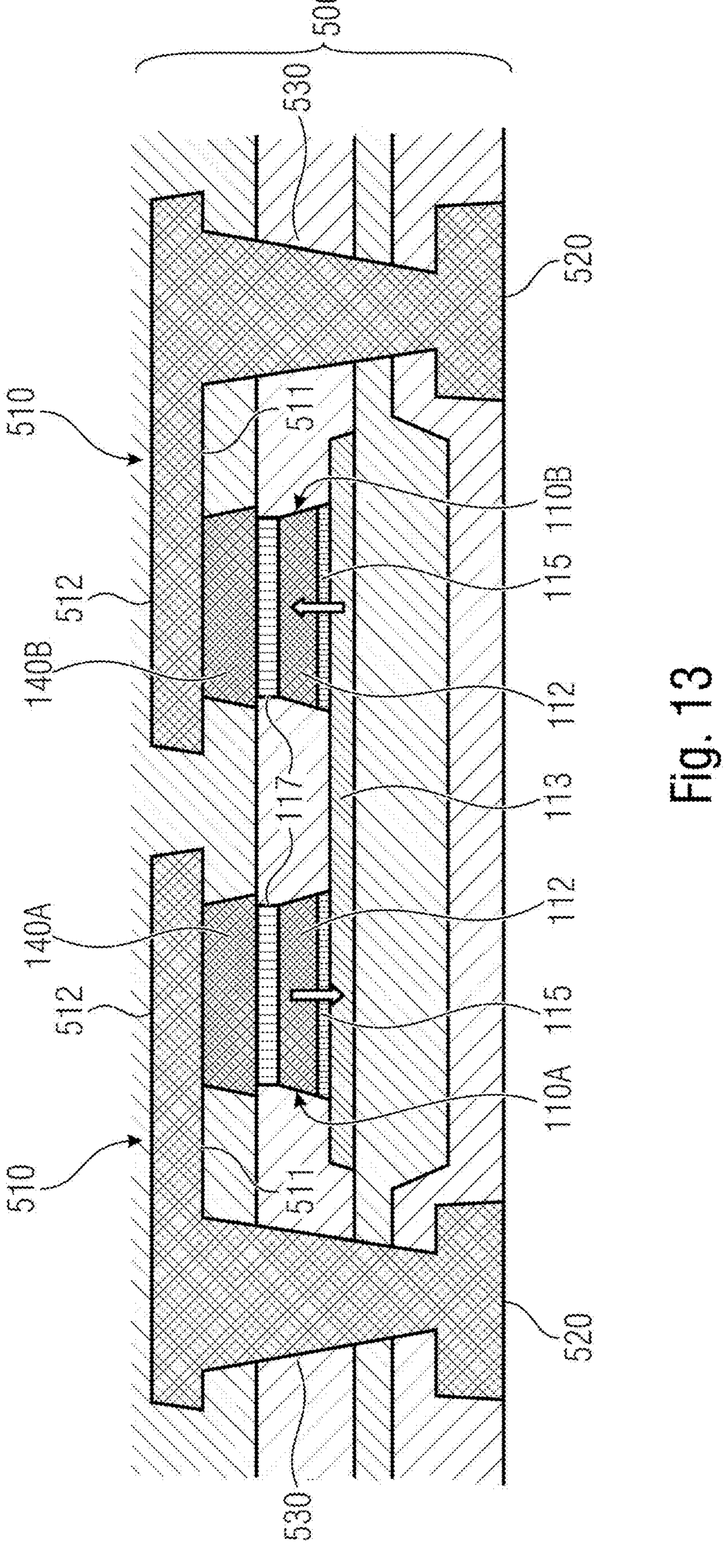
FIG. 13 shows a schematic sectional view of a multi-layer substrate having two integrated magnetoresistive elements and two vortex shielding elements arranged above it, according to a further example implementation.

FIG. 13 shows a further example implementation in which the shielding elements 140A, 140B are arranged above the magnetoresistive elements 110A, 110B. One difference from the example implementations discussed above is that, inter alia, both the magnetoresistive elements 110A, 110B and the shielding elements 140A, 140B each face the first surface 511 (for example bottom) of the top metal metallization layer 510. The shielding elements 140A, 140B are each arranged here between the top metal metallization layer 510 and the magnetoresistive elements 110A, 110B.

The magnetoresistive elements 110A, 110B and the shielding elements 140A, 140B are arranged opposite one other in the vertical direction, such that a respective magnetoresistive element 110A, 110B and a respective shielding element 140A, 140B overlap, seen in a plan view.

The shielding elements 140A, 140B may be galvanically coupled directly to the first surface 511 (for example bottom) of the top metal metallization layer 510. Optionally, a respective conductive layer 117, for example made of titanium nitride (TiN) or tantalum (Ta), may be provided between a magnetoresistive element 110A, 110B (including the top electrode 112) and a shielding element 140A, 140B. The magnetoresistive elements 110A, 110B may thus be galvanically coupled to the first surface 511 (for example bottom) of the top metal metallization layer 510 indirectly via the top electrode 112, the shielding elements 140A, 140B and the electrically conductive layer 117 optionally arranged between them.

Figure 14:
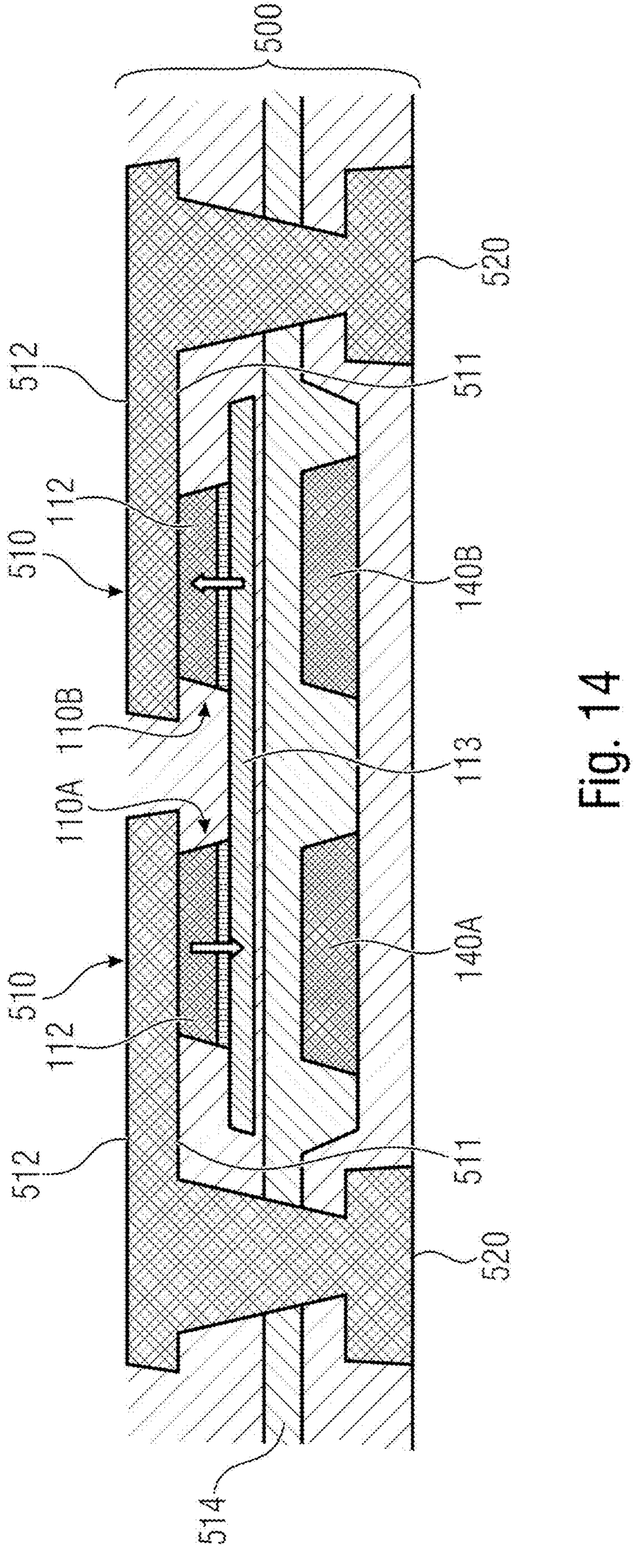
FIG. 14 shows a schematic sectional view of a multi-layer substrate having two integrated magnetoresistive elements and two vortex shielding elements arranged below it, according to one example implementation.
Figure 15:
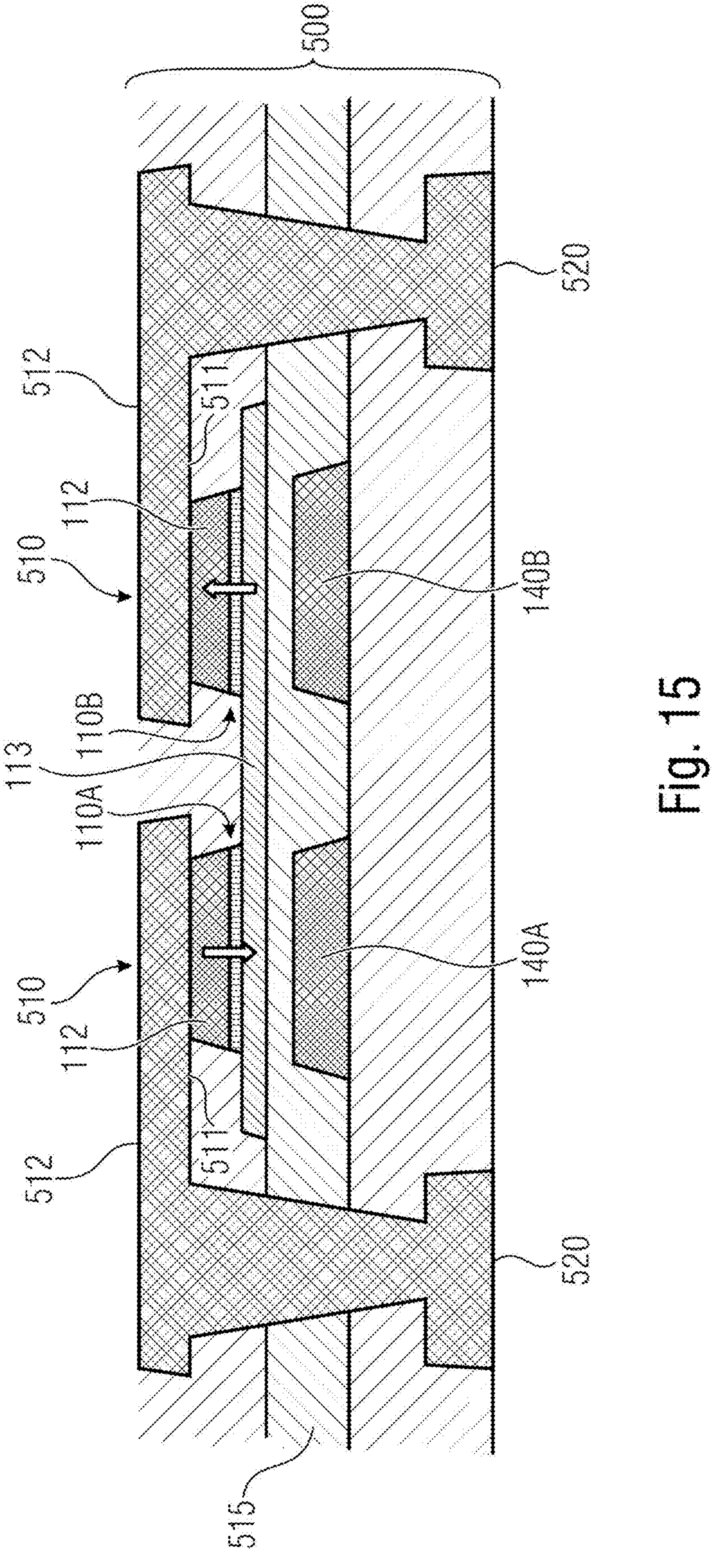
FIG. 15 shows a schematic sectional view of a multi-layer substrate having two integrated magnetoresistive elements and two vortex shielding elements arranged below it, according to a further example implementation.

FIGS. 14 and 15 show further example implementations, wherein the shielding elements 140A, 140B are however arranged here below the magnetoresistive elements 110A, 110B. Here, the magnetoresistive elements 110A, 110B are galvanically coupled to the metallization layer 510 either directly or (as illustrated in FIGS. 14 and 15 by way of example) via the electrode structure (top electrode) 112.

The magnetoresistive elements 110A, 110B and the shielding elements 140A, 140B may in this case each face a first surface 511, for example a bottom, of the metallization layer 510, wherein the magnetoresistive elements 110A, 110B may be arranged between the metallization layer 510 and the shielding elements 140A, 140B. The shielding elements 140A, 140B may be in direct contact with the magnetoresistive elements 110A, 110B and galvanically coupled thereto, or (as illustrated in FIGS. 14 and 15) may be spaced from the magnetoresistive elements 110A, 110B without contact and not galvanically coupled thereto.

As an alternative, a bottom electrode 113, described above, may be arranged between the shielding elements 140A, 140B and the magnetoresistive elements 110A, 110B and electrically connect the individual magnetoresistive elements 110A, 110B to one another. The shielding elements 140A, 140B may be in direct physical contact directly with the bottom electrode 113 and galvanically coupled thereto. The shielding elements 140A, 140B could thus be galvanically coupled to the magnetoresistive elements 110A, 110B indirectly (via the bottom electrode 113). As an alternative, the shielding elements 140A, 140B (as illustrated in FIGS. 14 and 15) may be spaced from the bottom electrode 113 without contact and not galvanically coupled thereto.

As may also be seen here, a respective magnetoresistive element 110A, 110B and a shielding element 140A, 140B may be arranged opposite one another, such that the respective magnetoresistive element 110A, 110B and the respective shielding element 140A, 140B overlap, seen in a plan view.

In all of the implementations described herein, the shielding elements 140A, 140B may for example be integrated in a process block that is already present from the outset in the substrate 500. This process block may for example have a pre-existing metallization layer 514 in which the shielding elements 140A, 140B could be integrated. The shielding elements 140A, 140B may for example here be electrically isolated from the bottom electrode 113, or alternatively also be in galvanic contact therewith.

It would likewise be conceivable for the shielding elements 140A, 140B to be integrated in a layer 515 (FIG. 15) that is introduced into the substrate 500 as an addition, and for example as an extra only for the purpose of integrating the shielding elements 140A, 140B. This may for example be a dielectric layer. The shielding elements 140A, 140B may thereby be electrically isolated from the magnetoresistive elements 110A, 110B. As an alternative, the shielding elements 140A, 140B may also be in galvanic contact with the bottom electrode 113.

In general, it would be conceivable for the arrangements of the shielding elements 140A, 140B relative to the magnetoresistive elements 110A, 110B, as described with reference to FIGS. 11 to 15, to be combined with one another as desired. In other words, one or more shielding elements 140A, 140B may be arranged below and/or above one or more magnetoresistive elements 110A, 110B.

As mentioned above, inter alia, with reference to FIGS. 6 to 8, the vortex magnetization 141 generates, within the shielding element 140, a magnetic stray field 150 that is counter to the direction of the external magnetic field 130. The stray field 150 may also correspond, in terms of magnitude, roughly to the external magnetic field 130, such that the magnetic field strength of the external magnetic field 130 is at least partially attenuated or compensated for.

One advantage of the vortex magnetization 141 described herein is, inter alia, that the vortex magnetization 141 generates a linear stray field 150 that increases linearly with the external field 130. The external field 130 is thus shielded with a constant factor, as long as the shielding element 140 is not yet in the state of magnetic saturation. This makes it possible to increase the linear working range of the magnetoresistive sensor 100. The authors of the present disclosure performed simulations to verify this. The results of these simulations will therefore be discussed in more detail below with reference to FIGS. 16 to 18. The numerical values and dimensions indicated therein should be understood as being purely example and in no way restrictive.

Figure 16:
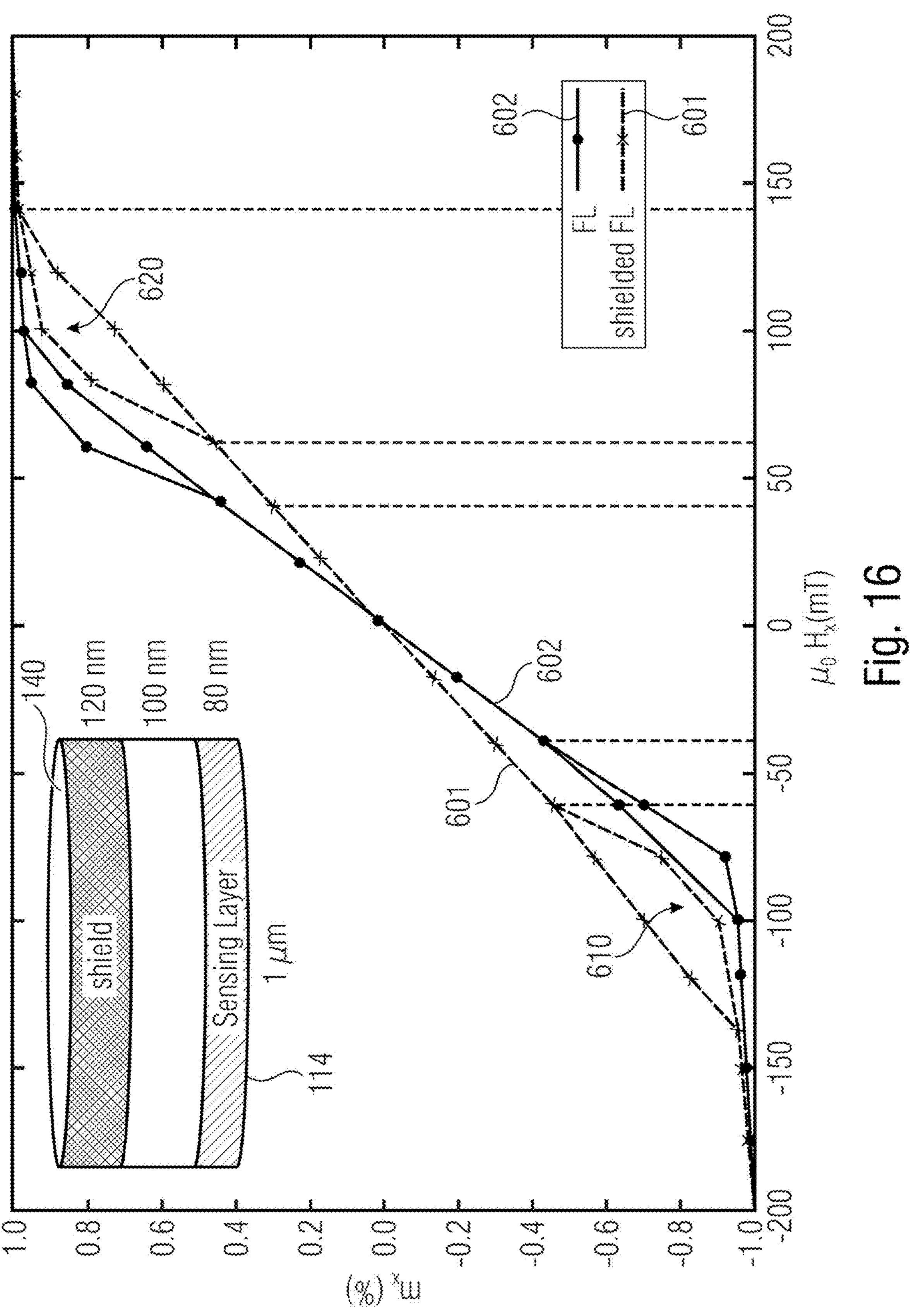
FIG. 16 shows a characteristic curve of a free layer having a vortex shielding element according to one example implementation.

FIG. 16 first of all shows the results of a simulation performed with a free layer ("Sensing Layer") 114 having a layer thickness of 80 nm and a shielding element 140 having a layer thickness of 120 nm. More generally speaking, the shielding element 140 here has a 1.5-fold greater layer thickness than the free layer 114. The free layer 114 and the shielding element 140 are arranged here at a distance of 100 nm in relation to one another.

In this simulation, the free layer 114 and the shielding element 140 also have the same diameter, for example 1 μm here. The shielding element 140 in this non-limiting example thus has an aspect ratio (layer thickness/diameter) of 120:1000=6:50. Since the shielding element 140 generates a linear stray field 150, the characteristic curve of the sensor including the shielding element 140, in a certain range, is likewise linear, which will be explained in more detail below.

Figure 17:
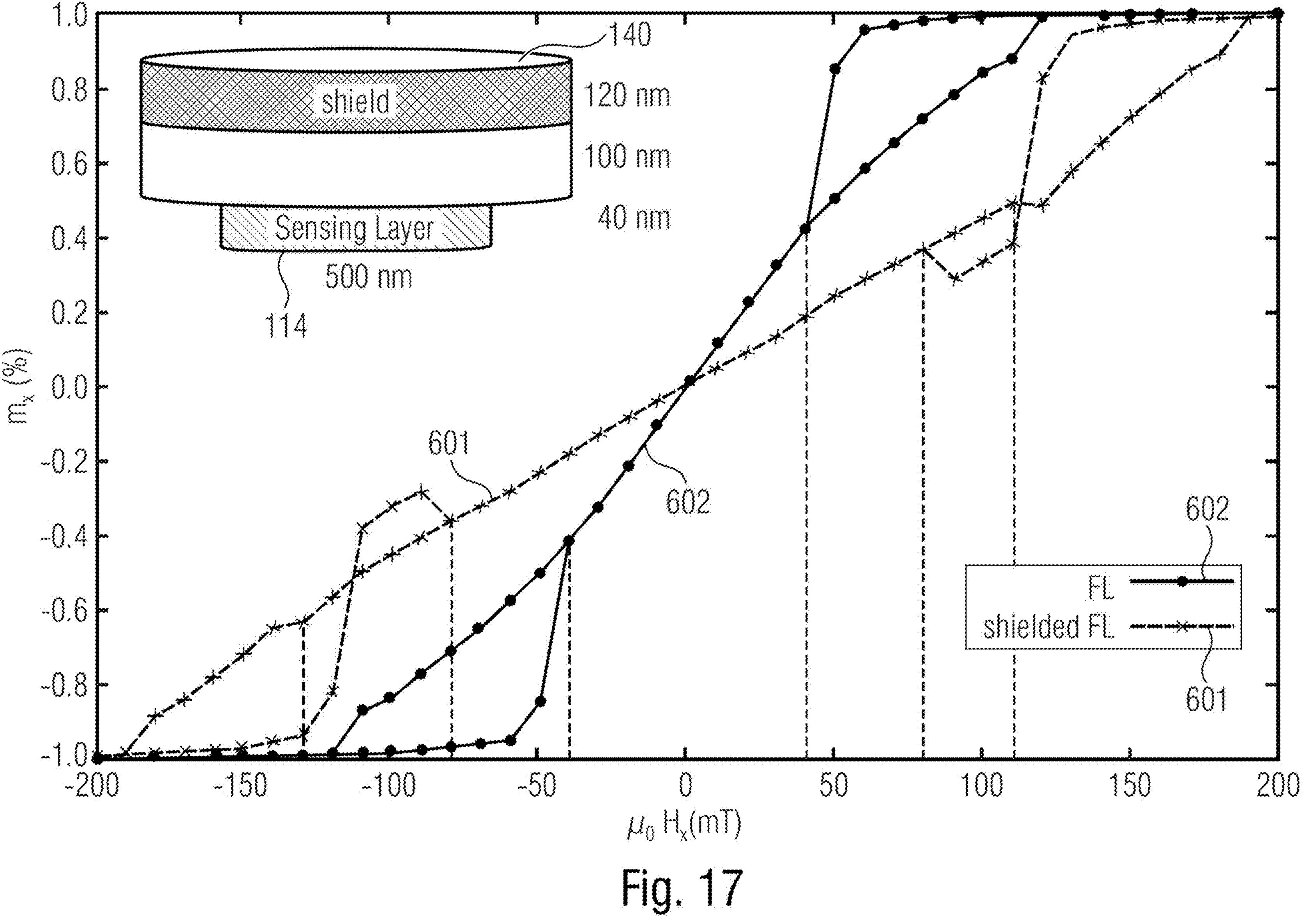
FIG. 17 shows a characteristic curve of a free layer having a vortex shielding element according to a further example implementation.
Figure 18:
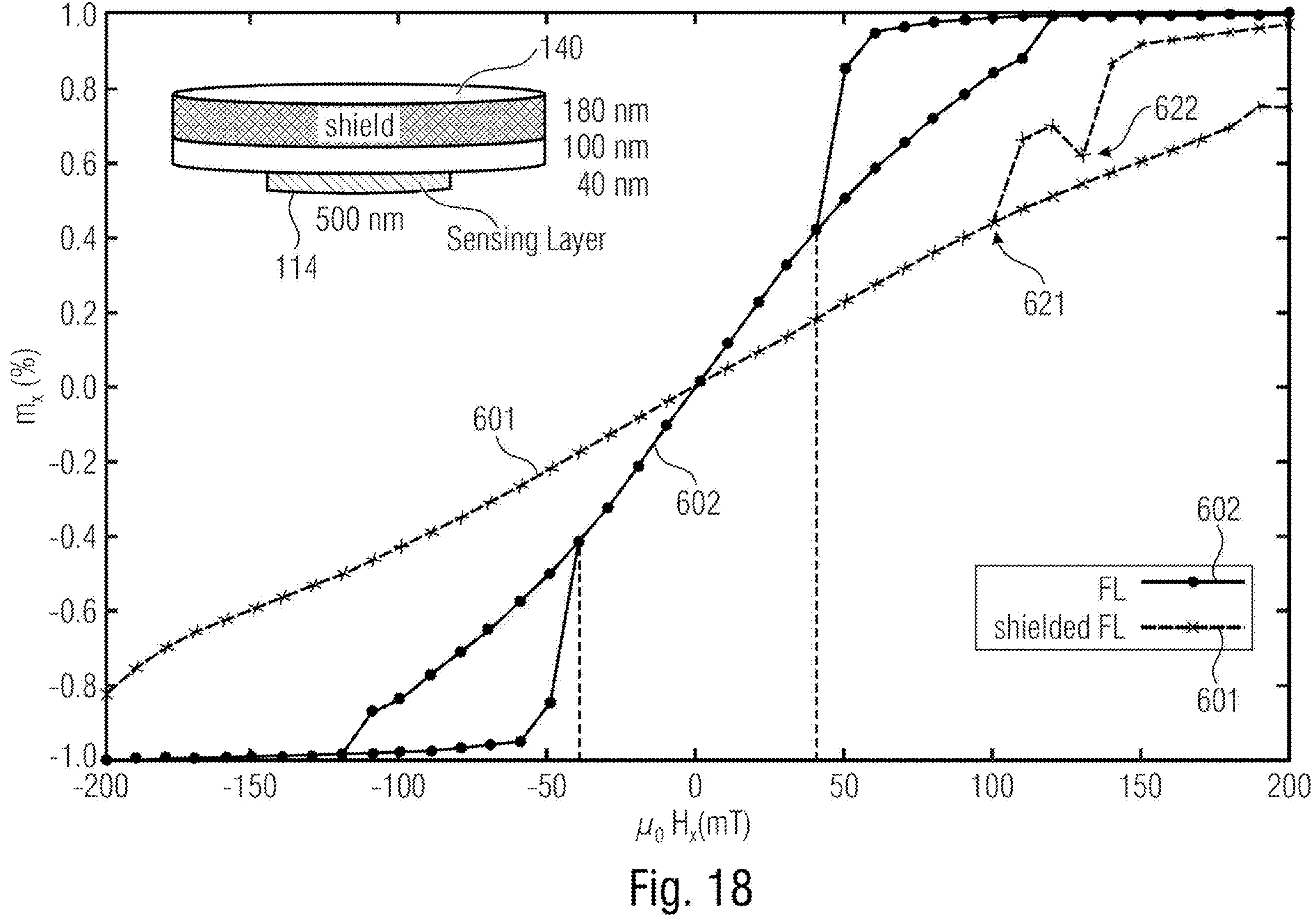
FIG. 18 shows a characteristic curve of a free layer having a vortex shielding element according to a further example implementation.

The curves 601, 602 illustrated in FIGS. 16 to 18 show a typical magnetic response of the magnetization of the free layer (with and without shielding element) as a function of an external magnetic field. In the case of very high fields, the signal saturates, and the vortex is destroyed or annihilated. The field starting from which this happens is referred to as annihilation field. If the field is reduced again, the vortex spontaneously reforms for energetic reasons when what is referred to as the nucleation field is dropped below, such that a characteristic hysteresis forms between the nucleation field and the annihilation field. The region between +/− nucleation field represents the linear working range, able to be used for a sensor, with a linear characteristic curve in which the free layer is always magnetized in the vortex configuration.

In FIG. 16, the curve 601 shows the linear working range of a sensor according to the innovative concept described herein with a vortex shielding element 140. The abovementioned jump to saturation, that is to say annihilation, occurs at roughly ±140 mT in each case. The abovementioned spontaneous reformation of the vortex state, that is to say nucleation, occurs at ±60 mT in each case. The linear working range therefore extends here from approximately −60 mT to +60 mT.

For comparison, the curve 602 shows the linear characteristic curve of a structurally identical sensor, but without the innovative vortex shielding element 140 described herein. As may be seen, the linear range of this sensor extends here only from −40 mT to +40 mT. In other words, the provision of a vortex shielding element 140 described herein thus leads to the linear range of the sensor being significantly increased (here by approximately 50%) in comparison to a structurally identical sensor without a shielding element 140.

FIG. 17 shows a further simulation result, wherein the layer thickness of the free layer 114 here is still only 40 nm, and the diameter of the free layer 114 is reduced to 500 nm, that is to say the free layer 114 has the same aspect ratio as the free layer 114 from FIG. 16, but is smaller overall. The shielding element 140, on the other hand, is the same size as before, and thus likewise has the same aspect ratio as in FIG. 16. In this example, the layer thickness of the shielding element 140 is thus three times greater than the layer thickness of the free layer 114, and the diameter of the shielding element 140 is twice as great as the diameter of the free layer 114.

In FIG. 17, the curve 601 again shows the linear working range of a sensor according to the innovative concept described herein with a vortex shielding element 140. Two different nucleation phases may be seen here. On the one hand, nucleation of the shielding element 140 occurs at roughly ±80 mT in each case. On the other hand, nucleation of the free layer 114 occurs at roughly ±120 mT in each case. The free layer 114 thus has a larger linear working range than the shielding element 140. The linear working range of the magnetoresistive sensor 100 is limited here to the smaller linear working range of the shielding element 140. The linear working range (range within +/− nucleation field) of the sensor 100 thus extends here from approximately −80 mT to +80 mT.

The +/− nucleation field of the free layer 114 is accordingly thus roughly ±120 mT, while the +/− nucleation field of the shielding element 140 is roughly ±80 mT, which is noticeable in the second, smaller hysteresis in the characteristic curve 601. The shielding element 140 accordingly thus has a smaller annihilation field and nucleation field in terms of magnitude, and therefore determines the maximum usable linear range in this configuration. An increase for example in the layer thickness of the shielding element 140 would increase its nucleation field, thus allowing a larger usable linear range of the sensor 100 (as shown below).

For comparison, curve 602 namely shows the linear characteristic curve of a structurally identical sensor that does not have a vortex shielding element 140. As may be seen, the linear range of this sensor extends from −40 mT to +40 mT. In other words, the provision of a vortex shielding element 140 described herein in this case leads to the linear range of the sensor being significantly increased (here by approximately 100%) in comparison to a structurally identical sensor without a shielding element 140.

FIG. 18 shows a further simulation result, wherein here, in addition to FIG. 17, the layer thickness of the shielding element 140 is increased to 180 nm, while still maintaining a constant diameter of 1 μm. The shielding element 140 in this example thus has an aspect ratio of 180:1000=9:50. The aspect ratio of the shielding element 140 is thus greater here than in the previous examples. Furthermore, in this example, the layer thickness of the shielding element 140 is 4.5 times greater than the layer thickness of the free layer 114, and the diameter of the shielding element 140 is twice as great as the diameter of the free layer 114.

The curve 601 again shows the linear working range of a sensor according to the innovative concept described herein with a vortex shielding element 140. Up to −200 mT, it is not possible to detect any annihilation, either of the shielding element 140 or of the free layer 114.

For positive magnetic fields, both the free layer 114 and the shielding element 140 are then annihilated at >=200 mT. A reduction in the field leads, starting from +130 mT, to nucleation of the shielding element 140 (see arrow 622) and, starting from roughly +100 mT, a reduction in the field leads to nucleation of the free layer 114 (see arrow 621). The linear range of the sensor 100 thus ranges up to roughly ±100 mT. Due to the increased layer thickness of the shielding element 140 compared to FIG. 17, the nucleation behavior of the free layer 114 then determines the maximum usable linear range.

For comparison, the curve 602 in this case too again shows the linear characteristic curve of a structurally identical sensor, without the innovative vortex shielding element 140 described herein. As may be seen, the linear range of this sensor extends from −40 mT to +40 mT. In other words, the provision of a vortex shielding element 140 described herein leads to the linear range of the sensor being significantly increased (here by approximately 150%) in comparison to a structurally identical sensor without a shielding element 140.

Depending on the dimension (diameter and/or layer thickness or aspect ratio) of the shielding element 140 relative to the dimensions of the free layer 114 or of the magnetoresistive element 110, the present innovative concept may be used to increase the linear working range of the magnetoresistive sensor 100 by at least 25% compared to the linear working range of a structurally identical sensor without the shielding element 140.

The example implementations described above merely illustrate the principles of the innovative concept described herein. It goes without saying that modifications and variations of the arrangements and details described herein will be obvious to others skilled in the art. It is therefore intended for the concept described herein to be limited only by the scope of protection of the patent claims below, and not by the specific details that have been presented herein with reference to the description and the explanation of the example implementations.

Although some aspects have been described in connection with a device, it goes without saying that these aspects also constitute a description of the corresponding method, such that a block or a component of a device should also be understood as a corresponding method step or as a feature of a method step. Similarly, aspects that have been described in connection with or as a method step also constitute a description of a corresponding block or detail or feature of a corresponding device.

ASPECTS

The following provides an overview of some Aspects of the present disclosure:

Aspect 1: A magnetoresistive sensor, comprising: at least one magnetoresistive element having a layer stack that has at least one free layer, wherein the at least one free layer has a magnetization that is changeable in a layer plane and that varies depending on a field strength of an external magnetic field acting parallel to the layer plane; and a shielding element that is configured, in a presence of the external magnetic field, to generate a linear magnetic stray field that is directed counter to the external magnetic field, wherein the shielding element has a first vortex magnetization with a first closed flux in the layer plane.

Aspect 2: The magnetoresistive sensor as Aspect in Aspect 1, wherein the shielding element is arranged opposite the free layer in a direction perpendicular to the layer plane.

Aspect 3: The magnetoresistive sensor as claimed in any of Aspects 1-2, wherein the shielding element has a geometric shape that is configured to generate the first vortex magnetization in the shielding element.

Aspect 4: The magnetoresistive sensor as claimed in any of Aspects 1-3, wherein the free layer has a second vortex magnetization with a second closed flux in the layer plane.

Aspect 5: The magnetoresistive sensor as claimed in any of Aspects 1-4, wherein the shielding element is galvanically coupled to the at least one magnetoresistive element.

Aspect 6: The magnetoresistive sensor as claimed in any of Aspects 1-5, wherein the magnetoresistive sensor has an electrode structure that is configured to make electrical contact with the at least one magnetoresistive element, and wherein the shielding element adjoins the electrode structure directly and is galvanically coupled directly to the electrode structure.

Aspect 7: The magnetoresistive sensor as claimed in any of Aspects 1-6, wherein the shielding element is electrically isolated from the magnetoresistive element.

Aspect 8: The magnetoresistive sensor as Aspect in Aspect 7, wherein a dielectric layer is arranged between the magnetoresistive element and the shielding element.

Aspect 9: The magnetoresistive sensor as claimed in any of Aspects 1-8, wherein the shielding element is spaced from the magnetoresistive element by a distance that is approximately 0.1 to 1 times as great as a diameter of the shielding element.

Aspect 10: The magnetoresistive sensor (100) as claimed in any of Aspects 1-9, wherein the shielding element has a layer thickness between 50 nm and 500 nm.

Aspect 11: The magnetoresistive sensor as claimed in any of Aspects 1-10, further comprising: a substrate having a metallization layer forming a metal contact, wherein the magnetoresistive element is galvanically coupled to the metallization layer, wherein the magnetoresistive element faces a first surface of the metallization layer, wherein the shielding element faces second surface of the metallization layer, the second surface being opposite to the first surface, wherein the metallization layer is arranged between the magnetoresistive element and the shielding element, and wherein the magnetoresistive element and the shielding element are arranged opposite one another, such that the magnetoresistive element and the shielding element overlap, when viewed in a plan view.

Aspect 12: The magnetoresistive sensor as Aspect in Aspect 11, wherein the shielding element is arranged directly on the second surface of the metallization layer and is galvanically coupled to the metallization layer.

Aspect 13: The magnetoresistive sensor as claimed in any of Aspects 1-12, further comprising: a substrate having a metallization layer forming a metal contact, wherein the magnetoresistive element is galvanically coupled to the metallization layer, wherein the magnetoresistive element faces a first surface of the metallization layer, wherein the shielding element faces the first surface of the metallization layer, wherein the magnetoresistive element is arranged between the metallization layer and the shielding element, and wherein the magnetoresistive element and the shielding element are arranged opposite one another, such that the magnetoresistive element and the shielding element overlap, when viewed in a plan view.

Aspect 14: The magnetoresistive sensor as claimed in any of Aspects 1-13, further comprising: a substrate having a metallization layer forming a metal contact, wherein the shielding element is galvanically coupled to the metallization layer and the magnetoresistive element, wherein the shielding element is arranged between the metallization layer and the magnetoresistive element, and wherein the magnetoresistive element and the shielding element are arranged opposite one another, such that the magnetoresistive element and the shielding element overlap, when viewed in a plan view.

Aspect 15: The magnetoresistive sensor as Aspect in Aspect 14, wherein the substrate is configured as a multi-layer substrate, and wherein the shielding element and the magnetoresistive element are each integrated into different layers of the multi-layer substrate.

Aspect 16: The magnetoresistive sensor as claimed in any of Aspects 1-15, wherein the magnetoresistive sensor with the shielding element exhibits linear behavior in a predefined working range, and wherein the predefined working range is greater than a linear working range of a structurally identical magnetoresistive sensor without the shielding element.

Aspect 17: The magnetoresistive sensor as Aspect in Aspect 16, wherein the predefined working range of the magnetoresistive sensor is at least 25% greater than the linear working range of the structurally identical sensor without the shielding element.

Aspect 18: The magnetoresistive sensor as Aspect in Aspect 16, wherein the magnetoresistive sensor with the shielding element exhibits the linear behavior across a full range of the predefined working range.

Aspect 19: The magnetoresistive sensor as claimed in any of Aspects 1-18, wherein the magnetoresistive sensor has an electrode structure that is configured to make electrical contact with the at least one magnetoresistive element, and wherein the shielding element is galvanically coupled to the electrode structure indirectly via an electrically conductive layer.

Aspect 20: The magnetoresistive sensor as Aspect in Aspect 11, wherein a dielectric layer is arranged between the shielding element and the second surface of the metallization layer.

Aspect 21: A system configured to perform one or more operations recited in one or more of Aspects 1-20.

Aspect 22: An apparatus comprising means for performing one or more operations recited in one or more of Aspects 1-20.

The invention claimed is:

1. A magnetoresistive sensor, comprising:

a magnetoresistive element having a layer stack that has a free layer, wherein the free layer has a magnetization that is changeable in a layer plane and that varies depending on a field strength of an external magnetic field acting parallel to the layer plane; and a shielding element that is configured, in a presence of the external magnetic field, to generate a linear magnetic stray field that is directed counter to the external magnetic field, wherein the shielding element has a first vortex magnetization with a first closed flux in the layer plane, and wherein the free layer has a vortex magnetization with a closed flux in the layer plane.

2. The magnetoresistive sensor as claimed in claim 1, wherein the shielding element is arranged opposite the free layer in a direction perpendicular to the layer plane.

3. The magnetoresistive sensor as claimed in claim 1, wherein the shielding element has a geometric shape that is configured to generate the first vortex magnetization in the shielding element.

4. The magnetoresistive sensor as claimed in claim 1, wherein the shielding element is galvanically coupled to magnetoresistive element.

5. The magnetoresistive sensor as claimed in claim 1, wherein the magnetoresistive sensor has an electrode structure that is configured to make electrical contact with the magnetoresistive element, and wherein the shielding element adjoins the electrode structure directly and is galvanically coupled directly to the electrode structure.

6. The magnetoresistive sensor as claimed in claim 1, wherein the shielding element is spaced from the magnetoresistive element by a distance that is approximately 0.1 to 1 times as great as a diameter of the shielding element.

7. The magnetoresistive sensor as claimed in claim 1, further comprising:

a substrate having a metallization layer forming a metal contact, wherein the magnetoresistive element is galvanically coupled to the metallization layer, wherein the magnetoresistive element faces a first surface of the metallization layer, wherein the shielding element faces the first surface of the metallization layer, wherein the magnetoresistive element is arranged between the metallization layer and the shielding element, and wherein the magnetoresistive element and the shielding element are arranged opposite one another, such that the magnetoresistive element and the shielding element overlap, when viewed in a plan view.

8. The magnetoresistive sensor as claimed in claim 1, wherein the magnetoresistive sensor has an electrode structure that is configured to make electrical contact with the magnetoresistive element, and wherein the shielding element is galvanically coupled to the electrode structure indirectly via an electrically conductive layer.

9. The magnetoresistive sensor as claimed in claim 1, wherein the shielding element is electrically isolated from the magnetoresistive element.

10. The magnetoresistive sensor as claimed in claim 9, wherein a dielectric layer is arranged between the magnetoresistive element and the shielding element.

11. The magnetoresistive sensor as claimed in claim 1, further comprising:

a substrate having a metallization layer forming a metal contact, wherein the magnetoresistive element is galvanically coupled to the metallization layer, wherein the magnetoresistive element faces a first surface of the metallization layer, wherein the shielding element faces second surface of the metallization layer, the second surface being opposite to the first surface, wherein the metallization layer is arranged between the magnetoresistive element and the shielding element, and wherein the magnetoresistive element and the shielding element are arranged opposite one another, such that the magnetoresistive element and the shielding element overlap, when viewed in a plan view.

12. The magnetoresistive sensor as claimed in claim 11, wherein the shielding element is arranged directly on the second surface of the metallization layer and is galvanically coupled to the metallization layer.

13. The magnetoresistive sensor as claimed in claim 11, wherein a dielectric layer is arranged between the shielding element and the second surface of the metallization layer.

14. The magnetoresistive sensor as claimed in claim 1, further comprising:

a substrate having a metallization layer forming a metal contact, wherein the shielding element is galvanically coupled to the metallization layer and the magnetoresistive element, wherein the shielding element is arranged between the metallization layer and the magnetoresistive element, and wherein the magnetoresistive element and the shielding element are arranged opposite one another, such that the magnetoresistive element and the shielding element overlap, when viewed in a plan view.

15. The magnetoresistive sensor as claimed in claim 14, wherein the substrate is configured as a multi-layer substrate, and wherein the shielding element and the magnetoresistive element are each integrated into different layers of the multi-layer substrate.

16. The magnetoresistive sensor as claimed in claim 1, wherein the magnetoresistive sensor with the shielding element exhibits linear behavior in a predefined working range, and wherein the predefined working range is greater than a linear working range of a structurally identical magnetoresistive sensor without the shielding element.

17. The magnetoresistive sensor as claimed in claim 16, wherein the predefined working range of the magnetoresistive sensor is at least 25% greater than the linear working range of the structurally identical magnetoresistive sensor without the shielding element.

18. The magnetoresistive sensor as claimed in claim 16, wherein the magnetoresistive sensor with the shielding element exhibits the linear behavior across a full range of the predefined working range.

19. A magnetoresistive sensor, comprising:

a magnetoresistive element having a layer stack that has a free layer, wherein the free layer has a magnetization that is changeable in a layer plane and that varies depending on a field strength of an external magnetic field acting parallel to the layer plane; and a shielding element that is configured, in a presence of the external magnetic field, to generate a linear magnetic stray field that is directed counter to the external magnetic field, wherein the shielding element has a first vortex magnetization with a first closed flux in the layer plane, wherein the shielding element has a layer thickness between 50 nm and 500 nm.

20. A magnetoresistive sensor, comprising:

a magnetoresistive element having a layer stack that has a free layer, wherein the free layer has a magnetization that is changeable in a layer plane and that varies depending on a field strength of an external magnetic field acting parallel to the layer plane; and a shielding element that is configured, in a presence of the external magnetic field, to generate a linear magnetic stray field that is directed counter to the external magnetic field, wherein the shielding element has a first vortex magnetization with a first closed flux in the layer plane, wherein, without the external magnetic field, the first vortex magnetization is in equilibrium, and wherein, in the presence of the external magnetic field, the first vortex magnetization shifts such that the shielding element generates the linear magnetic stray field outside of the shielding element to attenuate the external magnetic field.

* * * * *